United States Patent
Nishiwaki

(10) Patent No.: US 10,121,892 B2
(45) Date of Patent: Nov. 6, 2018

(54) SEMICONDUCTOR DEVICE

(71) Applicant: KABUSHIKI KAISHA TOSHIBA, Tokyo (JP)

(72) Inventor: Tatsuya Nishiwaki, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/252,208

(22) Filed: Aug. 30, 2016

(65) Prior Publication Data

US 2017/0263767 A1 Sep. 14, 2017

(30) Foreign Application Priority Data

Mar. 8, 2016 (JP) ................. 2016-044433

(51) Int. Cl.
*H01L 29/78* (2006.01)
*H01L 29/40* (2006.01)
*H01L 29/423* (2006.01)

(52) U.S. Cl.
CPC ........ *H01L 29/7827* (2013.01); *H01L 29/407* (2013.01); *H01L 29/4236* (2013.01)

(58) Field of Classification Search
None
See application file for complete search history.

(56) References Cited

U.S. PATENT DOCUMENTS

| | | | |
|---|---|---|---|
| 8,541,834 B2 | 9/2013 | Nozu | |
| 8,981,470 B2 | 3/2015 | Nozu | |
| 2006/0081903 A1 | 4/2006 | Inoue et al. | |
| 2008/0308870 A1 | 12/2008 | Faul et al. | |
| 2011/0186927 A1 | 8/2011 | Kawaguchi et al. | |
| 2012/0086074 A1* | 4/2012 | Hwang | H01L 27/10876 257/334 |

(Continued)

FOREIGN PATENT DOCUMENTS

| | | |
|---|---|---|
| EP | 1459386 B1 | 7/2010 |
| JP | 2005512342 A | 4/2005 |

(Continued)

OTHER PUBLICATIONS

Japanese Office Action dated May 31, 2018, filed in Japanese counterpart Application No. 2016-044433, 11 pages (with translation).

*Primary Examiner* — Ali Naraghi
(74) *Attorney, Agent, or Firm* — Patterson & Sheridan, LLP

(57) ABSTRACT

A semiconductor device includes a first semiconductor region of a first conductivity type, a second semiconductor region of a second conductivity type on the first semiconductor region, a third semiconductor region of the first conductivity type on the second semiconductor region, a first electrode surrounded by the first semiconductor region, a first insulating portion between a first part of the first electrode and the first semiconductor region, a second insulating portion having a higher dielectric constant than the first insulating portion, between a second part of the first electrode and the first semiconductor region, a gate electrode above the first electrode, and a gate insulating portion between the second semiconductor region and the gate electrode.

21 Claims, 20 Drawing Sheets

(56) References Cited

U.S. PATENT DOCUMENTS

| | | | |
|---|---|---|---|
| 2012/0126885 A1* | 5/2012 | Juengling | H01L 21/823431 327/581 |
| 2013/0043519 A1* | 2/2013 | Moon | H01L 29/4236 257/296 |
| 2014/0209999 A1* | 7/2014 | Sato | H01L 29/7813 257/330 |
| 2014/0374842 A1 | 12/2014 | Weber et al. | |
| 2016/0336414 A1* | 11/2016 | Kang | H01L 29/4236 |
| 2017/0338338 A1 | 11/2017 | Blank | |

FOREIGN PATENT DOCUMENTS

| | | |
|---|---|---|
| JP | 2008504697 A | 2/2008 |
| JP | 2009065120 A | 3/2009 |
| JP | 2011159763 A | 8/2011 |
| JP | 2011-199109 A | 10/2011 |
| JP | 2012-182199 A | 9/2012 |
| JP | 2012204529 A | 10/2012 |
| JP | 2014060298 A | 4/2014 |

\* cited by examiner

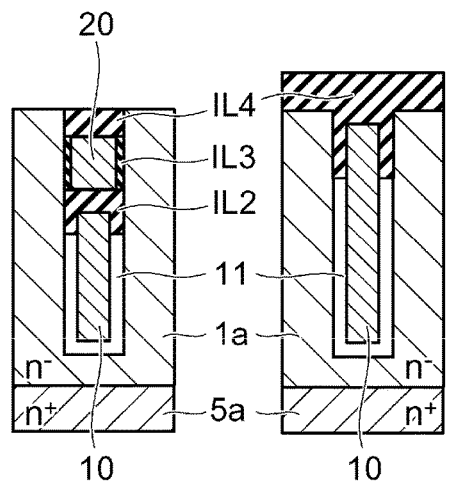
FIG. 8A
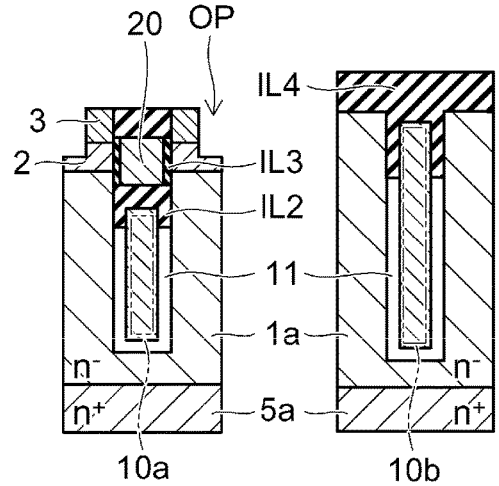
FIG. 8B
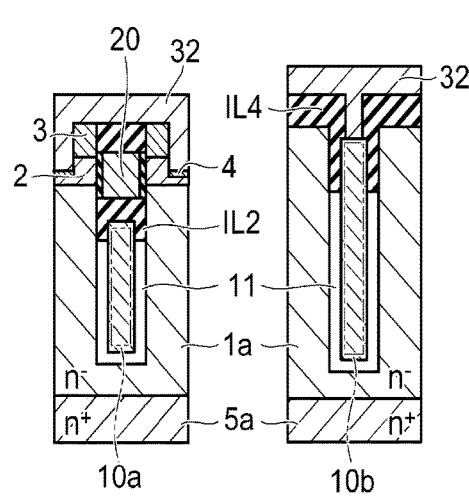
FIG. 8C
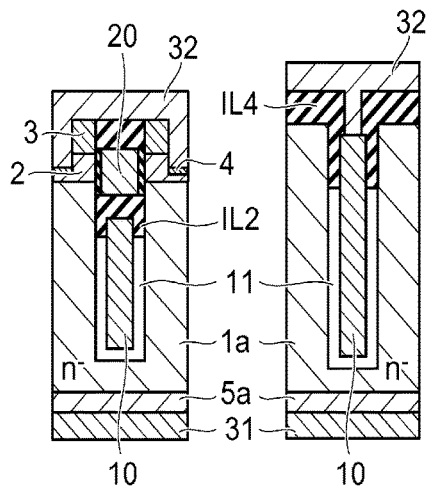
FIG. 8D
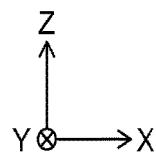

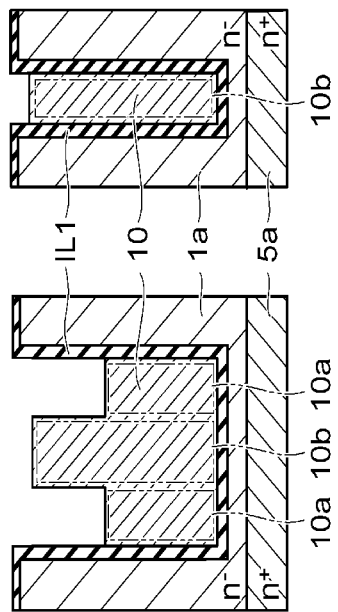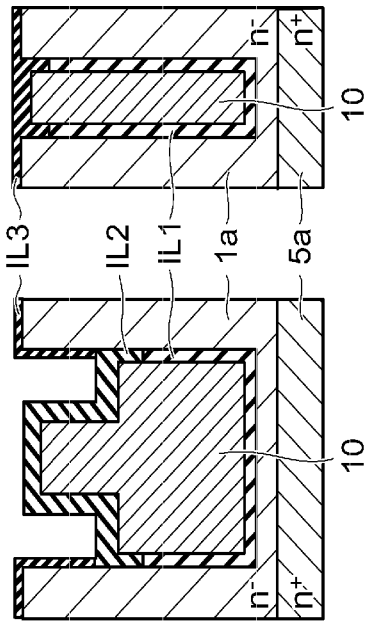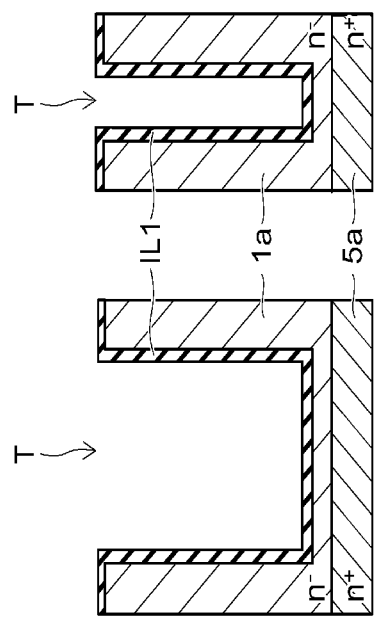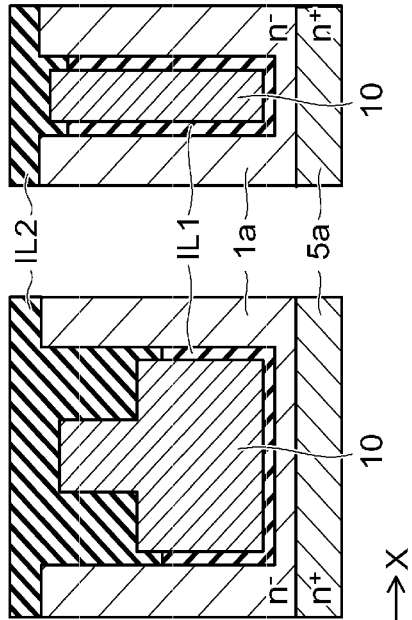

SEMICONDUCTOR DEVICE

CROSS-REFERENCE TO RELATED APPLICATION

This application is based upon and claims the benefit of priority from Japanese Patent Application No. 2016-044433, filed Mar. 8, 2016, the entire contents of which are incorporated herein by reference.

FIELD

Embodiments described herein relate generally to a semiconductor device.

BACKGROUND

A semiconductor device, such as metal-oxide-semiconductor field effect transistor (MOSFET), is used for power conversion. It is desirable that such a semiconductor device has a high breakdown voltage.

BRIEF DESCRIPTION OF THE DRAWINGS

FIGS. 8A to 8D are cross-sectional views each showing the manufacturing process of the semiconductor device according to the first embodiment.

FIGS. 18A to 18D are cross-sectional views each showing the manufacturing process of the semiconductor device according to the second embodiment.

DETAILED DESCRIPTION

Figure 1:
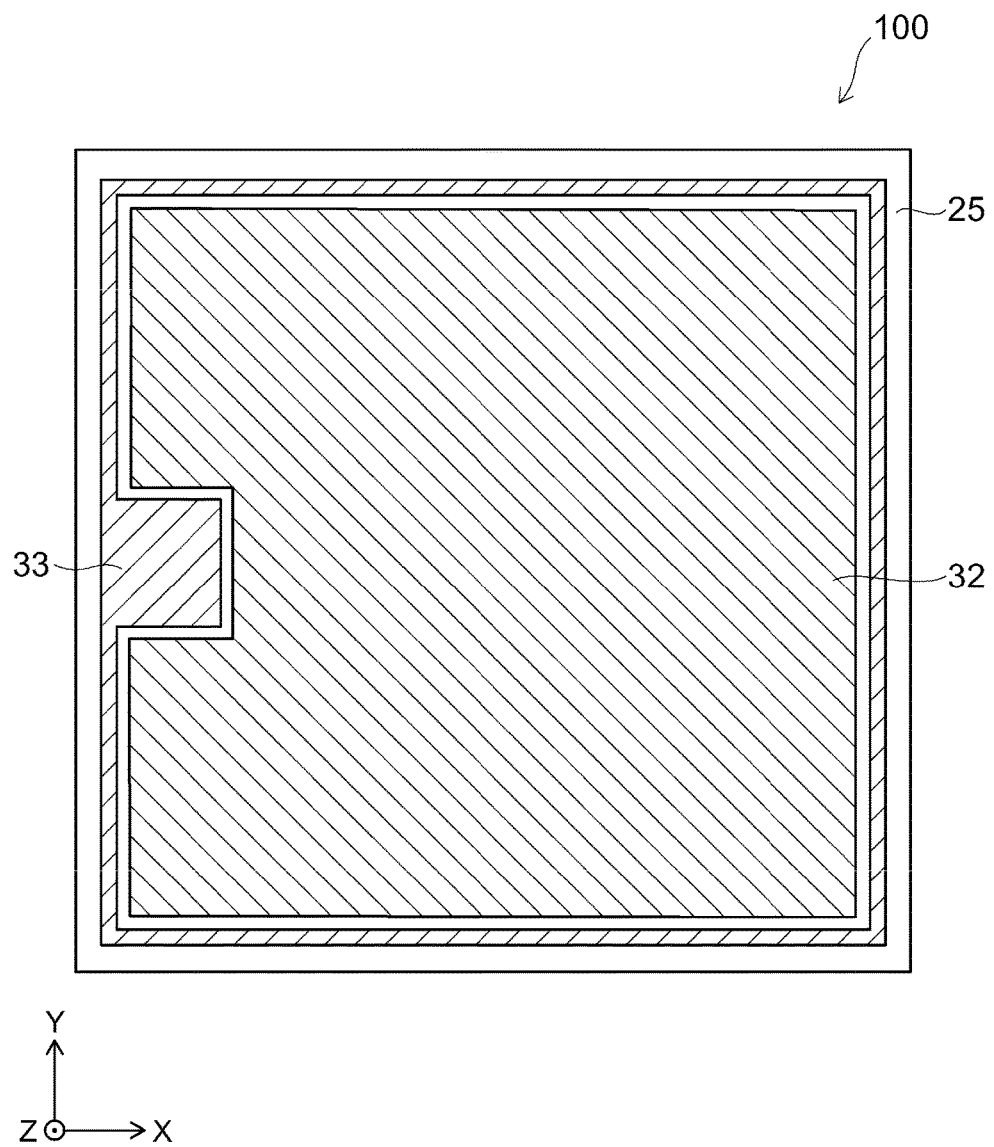
FIGS. 1-3 are each a top plan view of a semiconductor device according to a first embodiment.

Embodiments provide a semiconductor device with improved breakdown voltage.

In general, according to one embodiment, a semiconductor device includes a first semiconductor region of a first conductivity type, a second semiconductor region of a second conductivity type on the first semiconductor region, a third semiconductor region of the first conductivity type on the second semiconductor region, a first electrode surrounded by the first semiconductor region, a first insulating portion between a first part of the first electrode and the first semiconductor region, a second insulating portion having a higher dielectric constant than the first insulating portion, between a second part of the first electrode and the first semiconductor region, a gate electrode above the first electrode, and a gate insulating portion between the second semiconductor region and the gate electrode.

Hereinafter, exemplary embodiments will be described with reference to the drawings.

Here, the drawings are schematic and conceptual. It should be noted that a relationship between thickness and width of each drawn portion and a ratio of dimensions are not necessarily identical with actual ones. Further, even when the same portion is drawn, it may be sometimes shown with different dimensions and ratios across different drawings.

In the specification and the respective drawings, the same reference characters are attached to the same elements and the detailed description thereof is not repeated.

In the description of the embodiments, an xyz orthogonal coordinate system is used. A direction from an n⁻ type semiconductor region 1 to a p type base region 2 is defined as the Z direction, and two directions orthogonal to the Z direction are defined as the X direction and the Y direction.

In the following description, the sign of n⁺, n⁻, p⁺, and p indicates a relative degree of dopant concentration of the respective conductivity types. Specifically, the dopant concentration with the sign "+" indicates dopant concentration that is higher than that with no sign or with the sign "−", and the dopant concentration with the sign "−" indicates dopant concentration that is lower than that with no sign or with the sign "+".

In the respective embodiments described below, p type and n type may be switched in each semiconductor region.

First Embodiment

An example of a semiconductor device according to a first embodiment will be described with reference to FIGS. 1 to 5.

Figure 2:
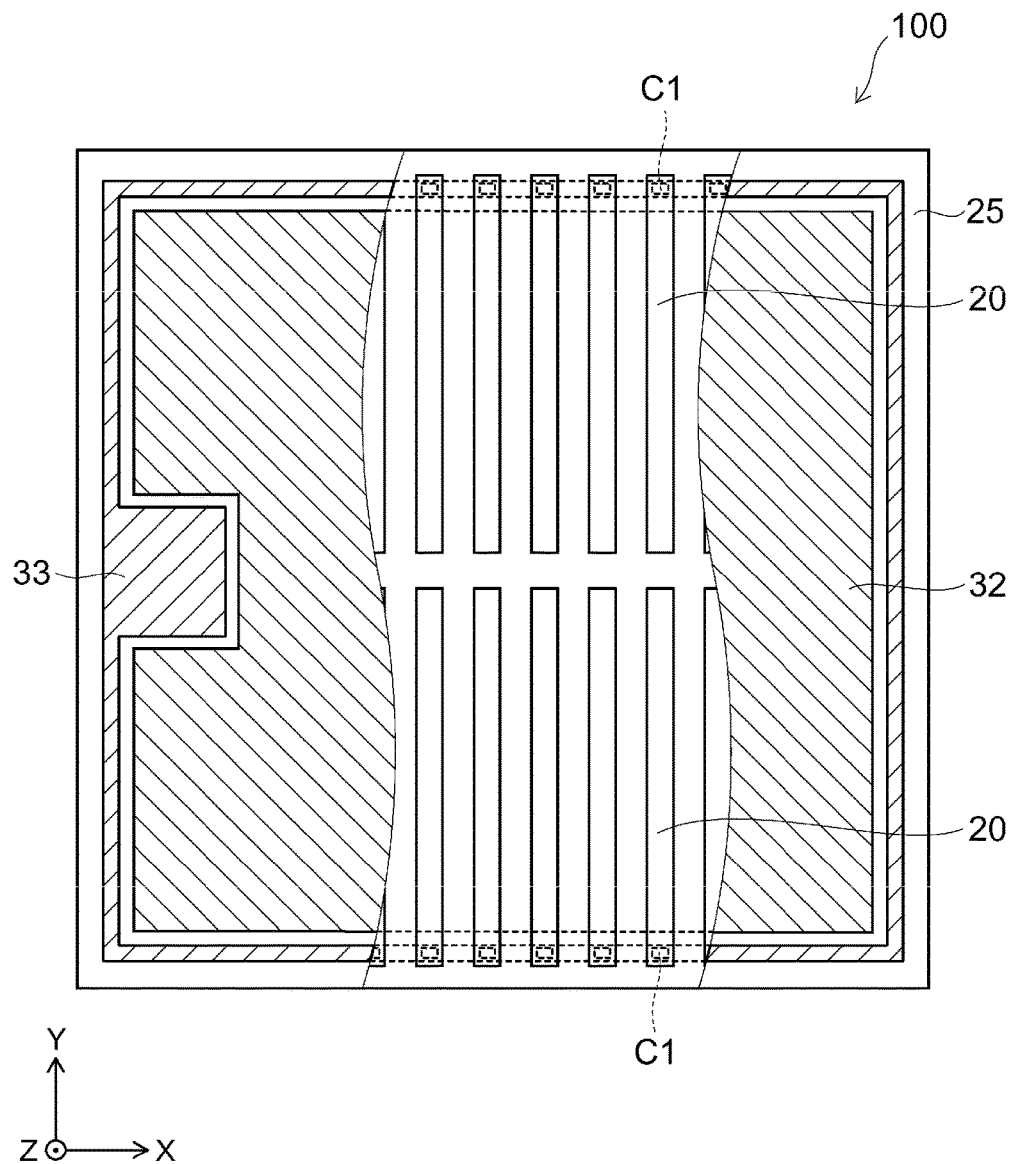
Figure 3:
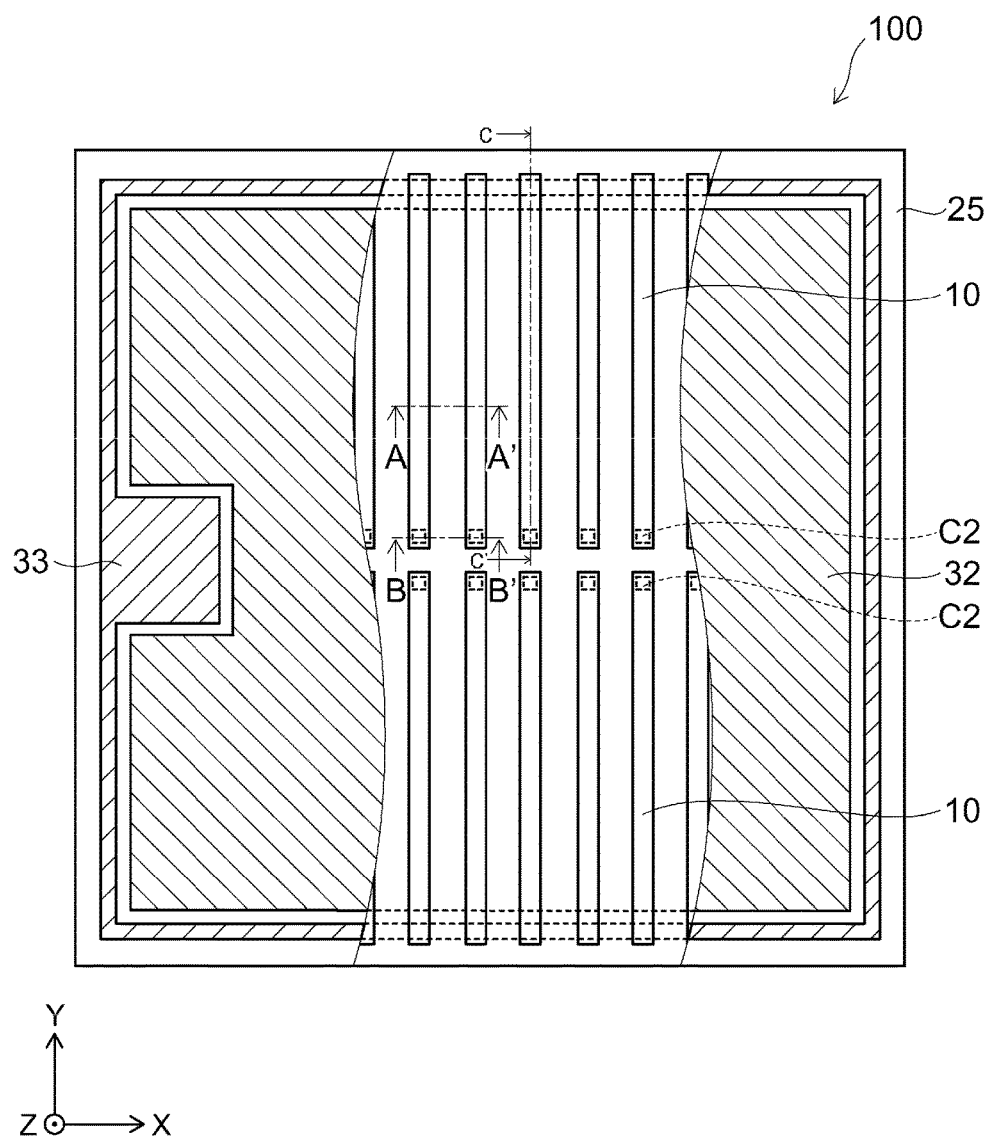

FIGS. 1 to 3 are top plan views of the semiconductor device 100 according to the first embodiment.

Figure 4A:
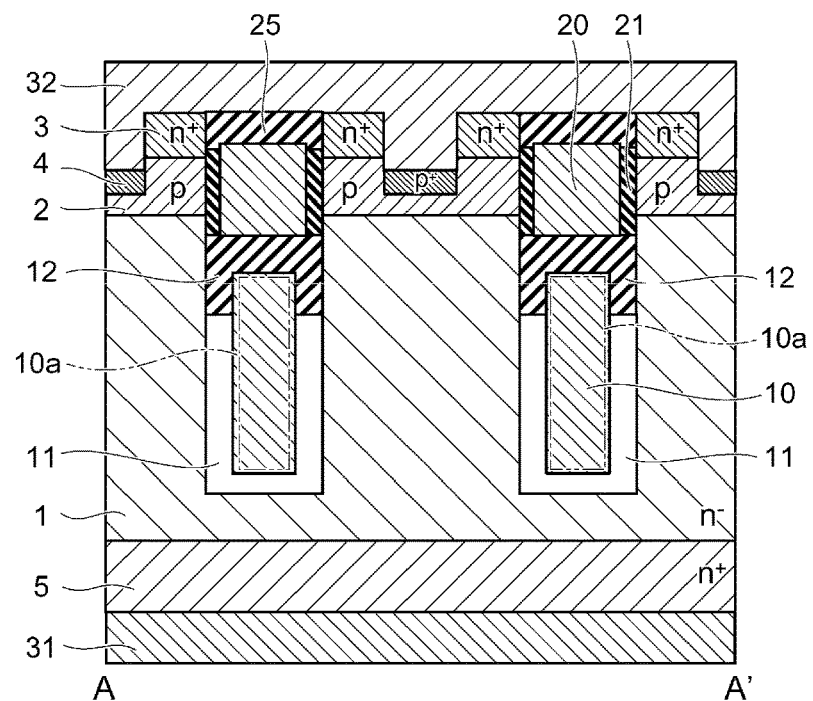
FIGS. 4A and 4B are cross-sectional views each showing a part of the semiconductor device according to the first embodiment.
Figure 4B:
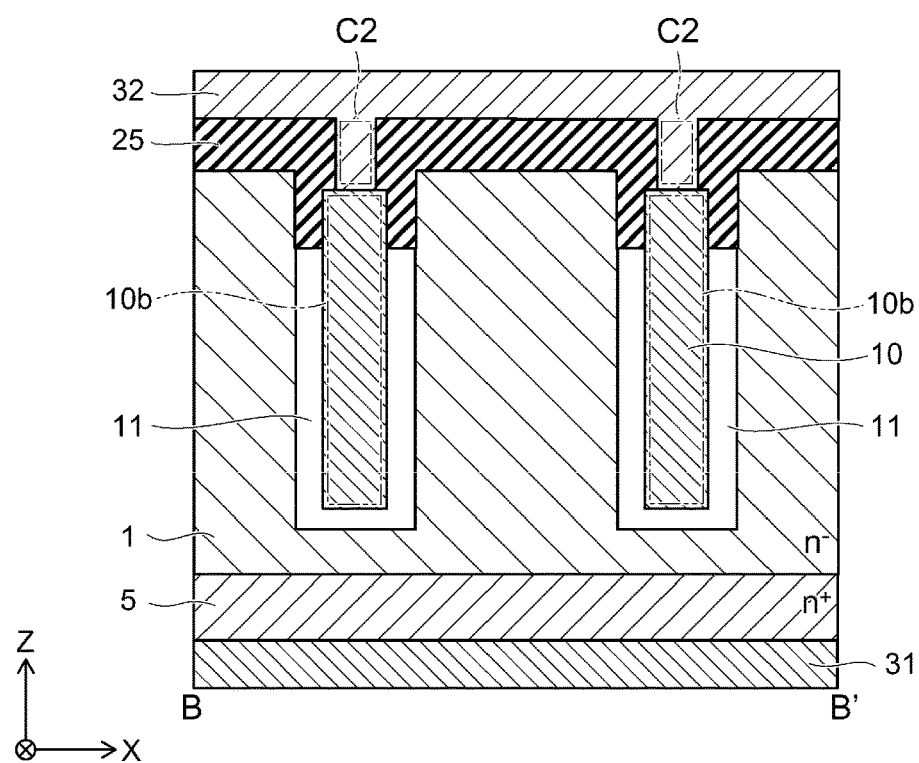

FIG. 4A is a cross-sectional view taken along the line A-A' in FIG. 3 and FIG. 4B is a cross-sectional view taken along the line B-B' in FIG. 3.

Figure 5:
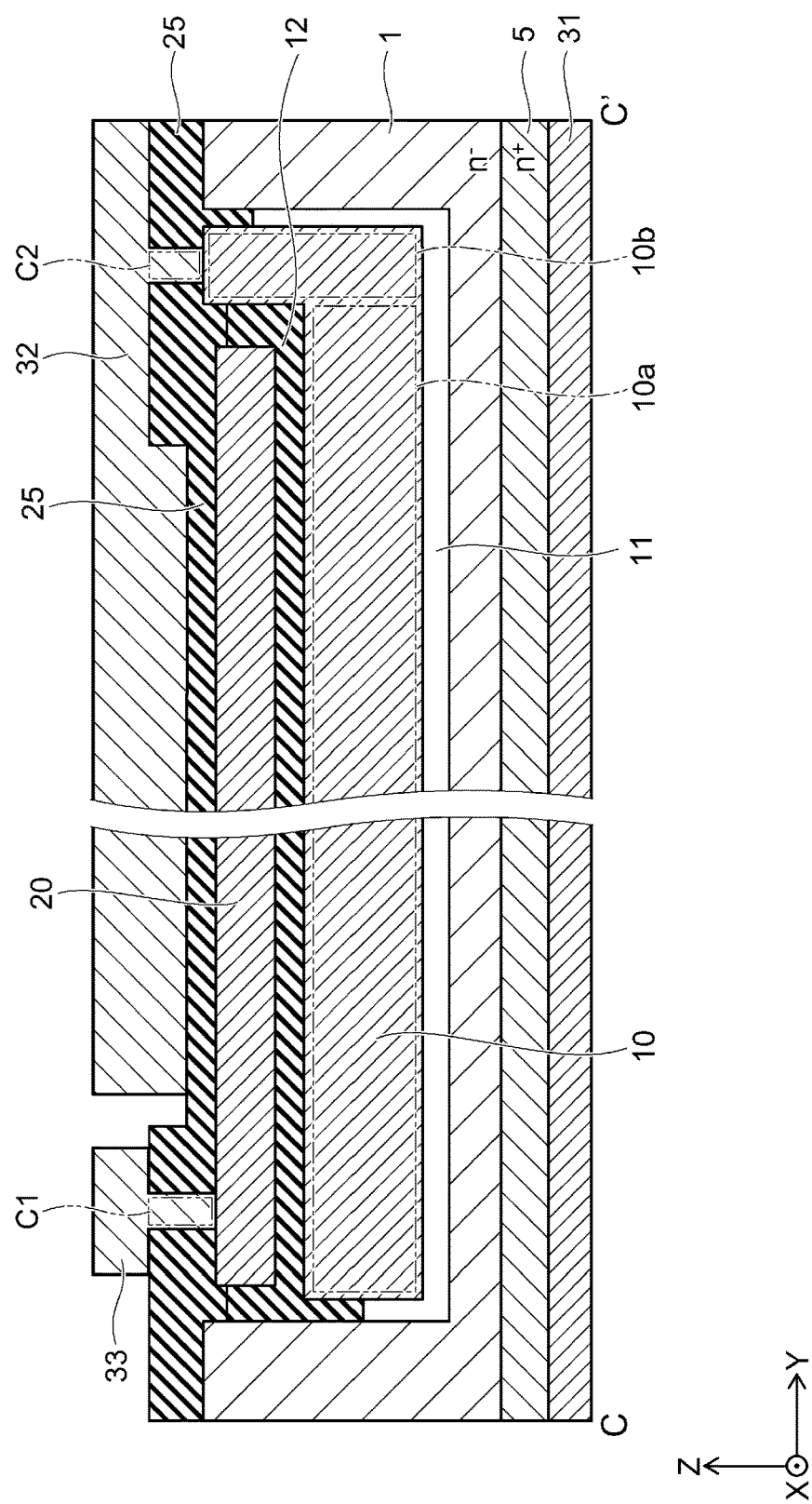
FIG. 5 is a cross-sectional view showing a part of the semiconductor device according to the first embodiment.

FIG. 5 is a cross-sectional view taken along the line C-C' in FIG. 3.

In FIG. 2, a part of an insulating layer 25, a source electrode 32, and a gate pad 33 is made transparent in order to show a gate electrode 20.

Similarly, in FIG. 3, a part of the insulating layer 25, the source electrode 32, and the gate pad 33 is made transparent in order to show a field plate electrode (hereinafter, referred to as an FP electrode) 10.

The semiconductor device 100 is, for example, a MOSFET.

As shown in FIGS. 1 to 5, the semiconductor device 100 includes an $n^+$ type (first conductivity type) drain region 5, an $n^-$ type semiconductor region 1 (first semiconductor region), a p type (second conductivity type) base region 2 (second semiconductor region), an $n^+$ type source region 3 (third semiconductor region), a $p^+$ type contact region 4, the FP electrode 10 (first electrode), a first insulating portion 11, a second insulating portion 12, the gate electrode 20, a gate insulating portion 21, the insulating layer 25, a drain electrode 31, the source electrode 32, and the gate pad 33.

As shown in FIG. 1, the source electrode 32 and the gate pad 33 are provided on the top surface of the semiconductor device 100 spaced apart from each other. A portion other than the source electrode 32 and gate pad 33 on the top surface of the semiconductor device 100 is covered with the insulating layer 25.

As shown in FIG. 2, a plurality of the gate electrodes 20 are arranged along the X direction and the Y direction, each extending in the Y direction. The respective gate electrodes 20 are electrically coupled to a portion of the gate pad 33 extending in the X direction through connection portions C1.

A part of the FP electrodes 10 is provided under the gate electrodes 20. As shown in FIG. 3, a plurality of the FP electrodes 10 are arranged along the X direction and the Y direction, each extending in the Y direction, similarly to the gate electrodes 20. The FP electrodes 10 are electrically coupled to the source electrode 32 through the connection portions C2.

As shown in FIGS. 4A and 4B and FIG. 5, the drain electrode 31 is provided on the bottom surface of the semiconductor device 100.

The $n^+$ type drain region 5 is provided on the drain electrode 31 to be electrically coupled to the drain electrode 31.

The $n^-$ type semiconductor region 1 is provided on the $n^+$ type drain region 5.

Each of the FP electrodes 10 is surrounded by the $n^-$ type semiconductor region 1 and the first insulating portion 11 and the second insulating portion 12 are provided between the $n^-$ type semiconductor region 1 and the FP electrode 10. The first insulating portion 11 is provided around the lower portion of the FP electrode 10. The second insulating portion 12 is provided around the upper portion of the FP electrode 10 and located above the first insulating portion 11.

In the semiconductor device 100, the first insulating portion 11 is a gap.

The gate electrode 20 is provided above a first electrode portion 10a with the second insulating portion 12 interposed therebetween.

The p type base region 2 is provided on the $n^-$ type semiconductor region 1 between the gate electrodes 20.

The $n^+$ type source region 3 and the p+ type contact region 4 are selectively provided on the p type base region 2.

A gate insulating portion 21 is provided between the p type base region 2 and the gate electrode 20.

The source electrode 32 is provided on the $n^+$ type source region 3 and the $p^+$ type contact region 4, and electrically coupled to these semiconductor regions. In the X direction, a part of the source electrode 32 is aligned with one of the $n^+$ type source region 3, the $p^+$ type contact region 4, and the insulating layer 25 that is provided between the gate electrode 20 and the source electrode 32, to electrically isolate these electrodes.

The structure around the FP electrode 10 and the gate electrode 20 will be more specifically described using FIGS. 4A and 4B and FIG. 5.

As shown in FIG. 5, the FP electrode 10 has the first electrode portion 10a and a second electrode portion 10b.

The first electrode portion 10a extends in the Y direction.

The second electrode portion 10b extends in the Z direction, to be in contact with the connection portion C2 of the source electrode 32.

The gate electrode 20 is aligned with a part of the first electrode portion 10a with the second insulating portion 12 interposed therebetween in the Z direction. The connection portion C1 of the gate pad 33 is located above the first electrode portion 10a. Further, the gate electrode 20 is aligned in the Z direction with the upper portion of the second electrode portion 10b with the second insulating portion 12 interposed therebetween in the Y direction.

Therefore, the length of the FP electrode 10 in the Y direction is longer than the length of the gate electrode 20 in the Y direction.

As shown in FIGS. 4A and 4B and FIG. 5, a part of the FP electrode 10 is provided between a part of the first insulating portion 11 and the other part of the first insulating portion 11 in the X direction and the Y direction.

Therefore, the length of the first insulating portion 11 in the X direction is longer than the length of the FP electrode 10 in the X direction. Further, the length of the first insulating portion 11 in the Y direction is longer than the length of the FP electrode 10 in the Y direction.

As shown in FIG. 5, apart of the first insulating portion 11 may be aligned with the gate electrode 20, with the second electrode portion 10b and the second insulating portion 12 interposed therebetween in the Y direction.

Here, the operation of the semiconductor device 100 will be described.

When a threshold voltage or more is applied to the gate electrode 20, with a positive voltage with respect to the source electrode 32 being applied to the drain electrode 31, the MOSFET is turned on. Here, a channel (inversion layer) is formed in the vicinity of the gate insulating portion 21 of the p type base region 2.

On the other hand, when the voltage applied to the gate electrode 20 is less than the threshold, the MOSFET is turned off. When the MOSFET is switched from the on state to the off state, a depletion layer expands from a pn junction surface of the $n^-$ type semiconductor region 1 and the p type base region 2 into the $n^-$ type semiconductor region 1. At the same time, according to a potential difference between the FP electrode 10 and the drain electrode 31, a depletion layer expands from an interface between the first insulating portion 11 and the $n^-$ type semiconductor region 1 and an interface between the second insulating portion 12 and the $n^-$ type semiconductor region 1 into the $n^-$ type semiconductor region 1. The FP electrodes 10 cause formation of depletion regions in the $n^-$ type semiconductor region 1, hence to improve a breakdown voltage in the semiconductor device. Alternatively, for the improved breakdown voltage of the semiconductor device, the n type dopant concentration in the $n^-$ type semiconductor region 1 can be increased, hence to reduce an on resistance in the semiconductor device.

Next, an example of the material of each component will be described.

The $n^-$ type semiconductor region 1, the p type base region 2, the $n^+$ type source region 3, the $p^+$ type contact region 4, and the $n^+$ type drain region 5 contain silicon, silicon carbide, gallium nitride, or gallium arsenic as the semiconductor material.

In the case of using silicon as the semiconductor material, arsenic, phosphorus, or antimony can be used as the n type dopant. Boron can be used as the p type dopant.

The FP electrode 10 and the gate electrode 20 contain a conductive material such as polysilicon.

The second insulating portion 12, the gate insulating portion 21, and the insulating layer 25 contain an insulating material such as silicon oxide. The insulating material of the second insulating portion 12 is selected so that the dielectric constant of the second insulating portion 12 can be higher than the dielectric constant of the first insulating portion 11.

The drain electrode 31, the source electrode 32, and the gate pad 33 contain metal such as aluminum.

An example of the manufacturing method of the semiconductor device 100 will be described with reference to FIGS. 6A to 8D.

FIGS. 6A to 8D are cross-sectional views each showing the manufacturing process of the semiconductor device according to the first embodiment.

In each of FIGS. 6A to 8D, the left side illustrates the cross-section taken along the line A-A' in FIG. 3 and the right side illustrates the cross-section taken along the line B-B' in FIG. 3.

Figure 6A:
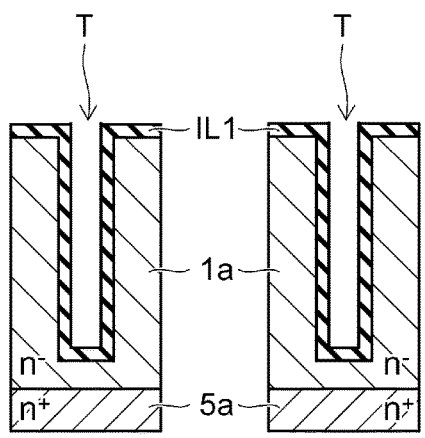
FIGS. 6A to 6D are cross-sectional views each showing the manufacturing process of the semiconductor device according to the first embodiment.

At first, a semiconductor substrate including an $n^+$ type semiconductor layer 5a and an $n^-$ type semiconductor layer 1a are formed. A plurality of trenches T extending in the Y direction are formed through the surface of the $n^-$ type semiconductor layer 1a. Continuously, an insulating layer IL1 is formed, e.g., by depositing silicon nitride using chemical vapor deposition (CVD) techniques, on the inner surface of the trench T and the top surface of the $n^-$ type semiconductor layer 1a (FIG. 6A).

Figure 6B:
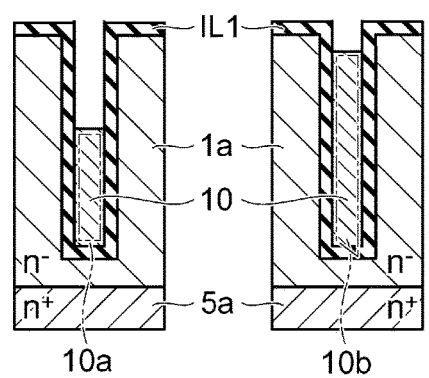

Next, a conductive layer is formed on the insulating layer IL1. By selectively etching back the top surface of the conductive layer, the FP electrode 10 including the first electrode portion 10a and the second electrode portion 10b is formed (FIG. 6B).

Figure 6C:
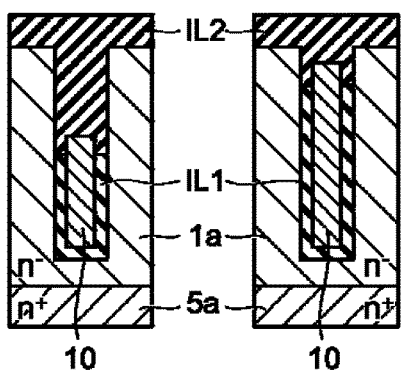

Next, the insulating layer IL1 is etched back so that the upper end of the insulating layer IL1 in contact with the first electrode portion 10a is located lower than the top surface of the FP electrode 10. Continuously, an insulating layer IL2 to fill the trench T is formed on the insulating layer IL1 and the FP electrode 10 (FIG. 6C). Here, such an insulating material for forming the insulating layer IL2 is one that makes it possible to selectively etch the insulating layer IL1 in the post process. As an example, when the insulating layer IL1 contains silicon nitride, silicon oxide can be used for the insulating layer IL2.

Figure 6D:
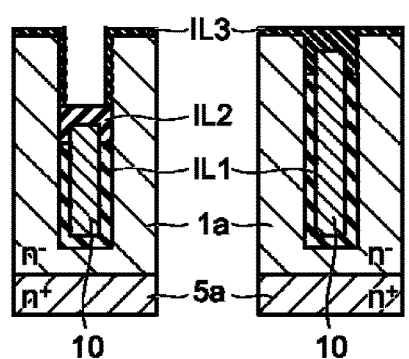

Then, a part of the insulating layer IL2 is removed, to expose the top surface of the $n^-$ type semiconductor layer 1a and a part of the inner wall of the trench T. Subsequently, the top surface of the exposed $n^-$ type semiconductor layer 1a and the inner wall of the trench T are thermally oxidized. According to the above process, the insulating layer IL2 along the top surface of the FP electrode 10 and the insulating layer IL3 along the inner wall of the trench T are formed (FIG. 6D).

Figure 7A:
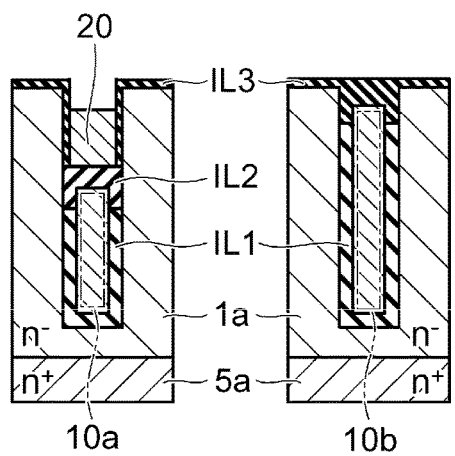
FIGS. 7A to 7D are cross-sectional views each showing the manufacturing process of the semiconductor device according to the first embodiment.
Figure 7B:
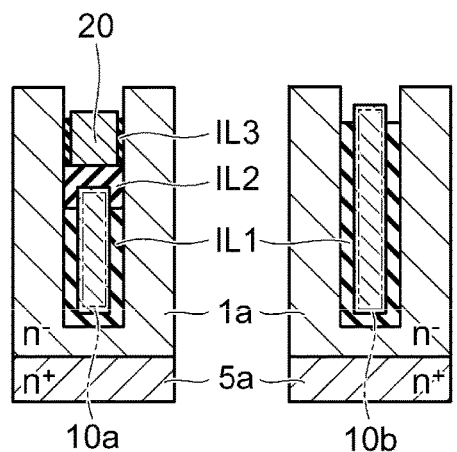

Next, a conductive layer is formed on the insulating layers IL2 and IL3 and the top surface of the conductive layer is etched back, to form the gate electrode 20 above the first electrode portion 10a (FIG. 7A). Thereafter, a part of the insulating layer IL3 is removed to expose the top surface of the insulating layer IL1 provided around the second electrode portion 10b (FIG. 7B).

Figure 7C:
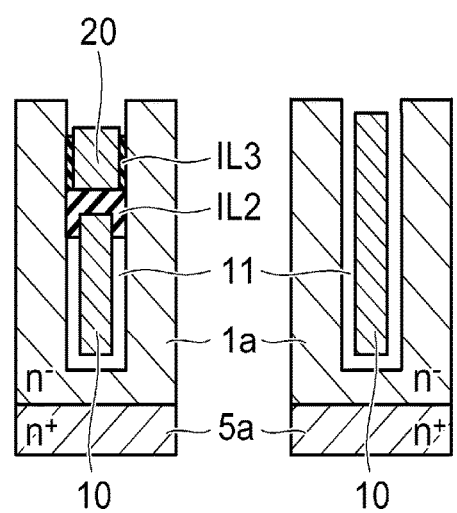

Next, through a wet etching process, the insulating layer IL1 exposed in the previous process is removed and simultaneously, liquid chemical is introduced into the trench T. Accordingly, the insulating layer IL1 between the FP electrode 10 and the $n^-$ type semiconductor layer 1a is removed, and a gap (first insulating portion 11) is formed between the FP electrode 10 and the $n^-$ type semiconductor layer 1a (FIG. 7C). As an example, when the insulating layer IL1 contains silicon nitride and the insulating layer IL2 contains silicon oxide, the insulating layer IL1 can be selectively removed with respect to the insulating layer IL2 according to the wet etching using phosphoric acid.

Figure 7D:
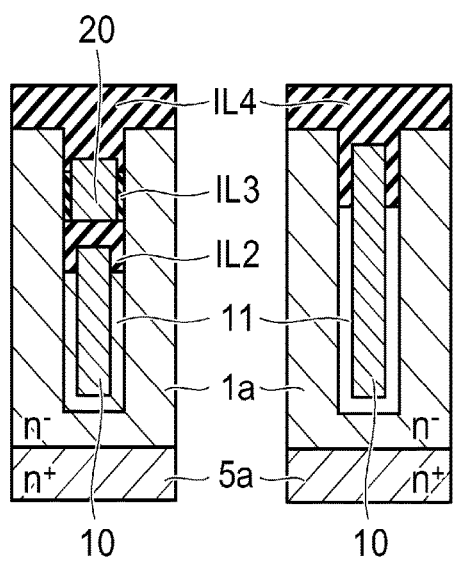

Next, an insulating layer IL4 is formed on the top surface of the $n^-$ type semiconductor layer 1a. For example, silicon oxide is formed using CVD techniques. The insulating layer IL4 plugs the upper portion of the gap formed between the FP electrode 10 and the $n^-$ type semiconductor layer 1a (FIG. 7D). Here, the insulating layer IL4 may be formed in a pressure reduced atmosphere in order to suppress a warping of the substrate due to the thermal expansion of a gas in the gap and a damage of the insulating layer IL4 in a subsequent process. In this case, the air pressure of the gap is less than the atmospheric pressure.

Next, a part of the insulating layer IL4 is removed, to expose the top surface of the $n^-$ type semiconductor layer 1a adjacent to the gate electrode 20 (FIG. 8A). Subsequently, p type dopant and n type dopant ions are sequentially implanted on the top surface of the exposed $n^-$ type semiconductor layer 1a, hence to form the p type base region 2 and the $n^+$ type source region 3. Thereafter, an opening OP reaching the p type base region 2 after penetrating the $n^+$ type source region 3 is formed (FIG. 8B).

Next, the p type dopant ions are implanted in a part of the p type base region 2 through the opening OP, hence to form the $p^+$ type contact region 4. Subsequently, the opening is formed in the insulating layer IL4, to expose the top surface of the second electrode portion 10b. Thereafter, a metal layer covering the $n^+$ type source region 3, the $p^+$ type contact region 4, and the insulating layer IL4 is formed and by patterning the metal layer, the source electrode 32 and the gate pad 33 (not illustrated in FIG. 8) are formed (FIG. 8C).

Next, the rear surface of the $n^+$ type semiconductor layer 5a is polished until it is of a predetermined thickness. Then, a metal layer is formed on the $n^+$ type semiconductor layer 5a, hence to form the drain electrode 31 (FIG. 8D).

According to the above process, the semiconductor device 100 as shown in FIGS. 1 to 5 can be obtained.

For the above mentioned manufacturing process, the chemical vapor deposition (CVD) method can be used to form the respective insulating layers and the respective conductive layers. The physical vapor deposition (PVD) method or the plating method can be used to form the respective metal layers.

The wet etching, the reactive ion etching (RIE) method, and the chemical dry etching (CDE) method can be properly selected to etch the respective insulating layers and the respective conductive layers, unless otherwise especially described.

Here, effects and advantages achieved by the embodiment will be described.

As described above, when the semiconductor device is switched from the on state to the off state, the depletion layer expands from the interface between the insulating portion provided around the FP electrode 10 and the n⁻ type semiconductor region 1 and the pn junction surface into the n⁻ type semiconductor region 1. When the depletion layer fully expands into the n⁻ type semiconductor region 1, the electric field intensity in the interface between the insulating portion and the n⁻ type semiconductor region 1 and on the pn junction surface rises. Here, when the thickness of the insulating portion is small, the electric field intensity exceeds a critical electric field of the n⁻ type semiconductor region 1, a breakdown occurs, and the breakdown voltage of the semiconductor device is deteriorated. On the other hand, when the thickness of the insulating portion is large, the depletion layer barely expands into the n⁻ type semiconductor region 1 and the breakdown voltage of the semiconductor device is reduced. Accordingly, the insulating portion is preferably as thin as possible so long as a breakdown does not occur in the n⁻ type semiconductor region 1.

In the semiconductor device according to the embodiment, the gap is formed between the FP electrode 10 and the n⁻ type semiconductor region 1, as the first insulating portion 11. The dielectric constant in an air or in a vacuum is lower than the dielectric constants of a silicon oxide layer and a silicon nitride layer. Therefore, by forming the gap as the first insulating portion 11, a thickness of the first insulating portion 11 that is required to suppress a breakdown in the n⁻ type semiconductor region 1 and to hold the breakdown voltage of the semiconductor device can be decreased. Specifically, when the specific dielectric constant in air or vacuum is defined as k0 and the specific dielectric constant of the silicon oxide layer or the silicon nitride layer is defined as ki, the first insulating portion 11 is formed into a gap from the silicon oxide layer or the silicon nitride layer; as a result, the thickness of the first insulating portion 11 can be k0/ki times. Decrease in the thickness of the first insulating portion 11 can increase the number of the gate electrodes 20 per unit area and reduce the on resistance of the semiconductor device. Alternatively, while suppressing an increase in the on resistance of the semiconductor device, the semiconductor device can be downsized.

Further, according to the embodiment, the breakdown voltage in the semiconductor device can be improved. This point will be described with reference to FIG. 9.

Figure 9:
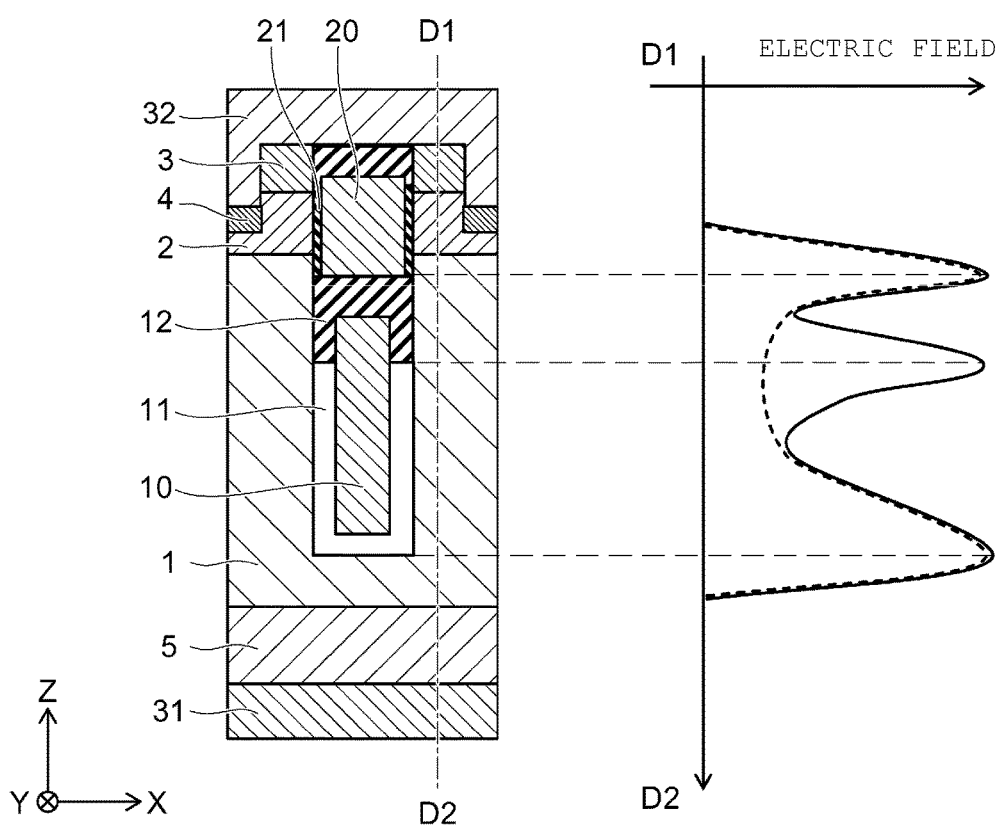
FIG. 9 is a schematic view showing electric field intensities within an n⁻ type semiconductor region at respective points of a first insulating portion and a second insulating portion.

FIG. 9 is a schematic view showing the electric field intensity within the n⁻ type semiconductor region 1 at respective points in the first insulating portion 11 and the second insulating portion 12.

In the graph at the right side in FIG. 9, the horizontal axis indicates the electric field intensity and the vertical axis indicates the position in the Z direction within the respective insulating portions. In the graph, a solid line indicates the electric field intensity distribution in the semiconductor device according to the embodiment. A dotted line indicates the electric field intensity distribution in the semiconductor device according to the related art, with the silicon oxide layer being uniformly provided between the FP electrode 10 and the n⁻ type semiconductor region 1.

In the semiconductor device according to the embodiment, the first insulating portion 11 and the second insulating portion 12 are provided between the FP electrode 10 and the n⁻ type semiconductor region 1. The dielectric constant of the second insulating portion 12 is higher than the dielectric constant of the first insulating portion 11. Thus, when the insulating portions having different dielectric constants are provided, as shown in FIG. 9, the electric field intensity between these insulating portions can be enhanced. Since the breakdown voltage of the semiconductor device is the value obtained by integrating the electric field intensities at the respective points, the breakdown voltage in the semiconductor device can be improved more than that in the semiconductor device according to the related art, by enhancing the electric field intensity between the first insulating portion 11 and the second insulating portion 12. Alternatively, the n type dopant concentration in the n⁻ type semiconductor region 1 can be increased by the improved breakdown voltage of the semiconductor device, and the on resistance of the semiconductor device can be reduced.

According to one example of the embodiment, it is possible to improve a breakdown voltage while reducing the on resistance in the semiconductor device.

The semiconductor device according to the embodiment is not restricted to the above mentioned example.

Hereinafter, using FIGS. 10A to 13B, a semiconductor device according to a modified example of the embodiment will be described. In the semiconductor device according to the following modified example, the arrangement of the FP electrode 10, the gate electrode 20, the source electrode 32, and the gate pad 33 is the same as, for example, that of the semiconductor device 100. In each drawing, A corresponds to the cross-sectional view taken along the line A-A' in FIG. 3 and B corresponds to the cross-sectional view taken along the line B-B' in FIG. 3.

First Modified Example

Figure 10A:
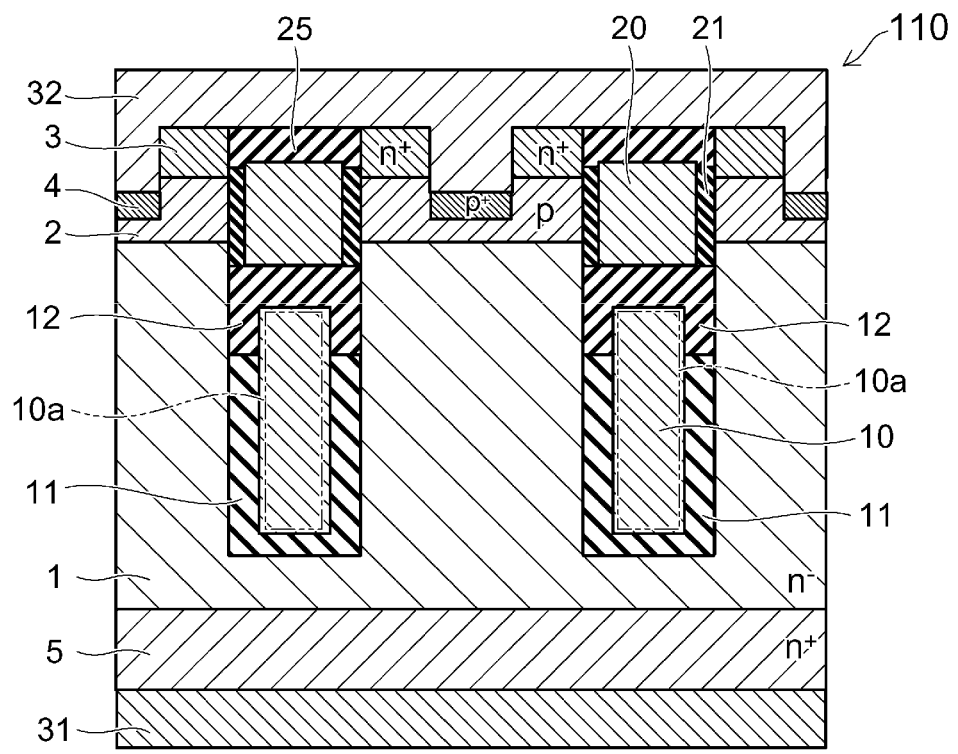
FIGS. 10A and 10B are cross-sectional views each showing a part of a semiconductor device according to a first modified example of the first embodiment.
Figure 10B:
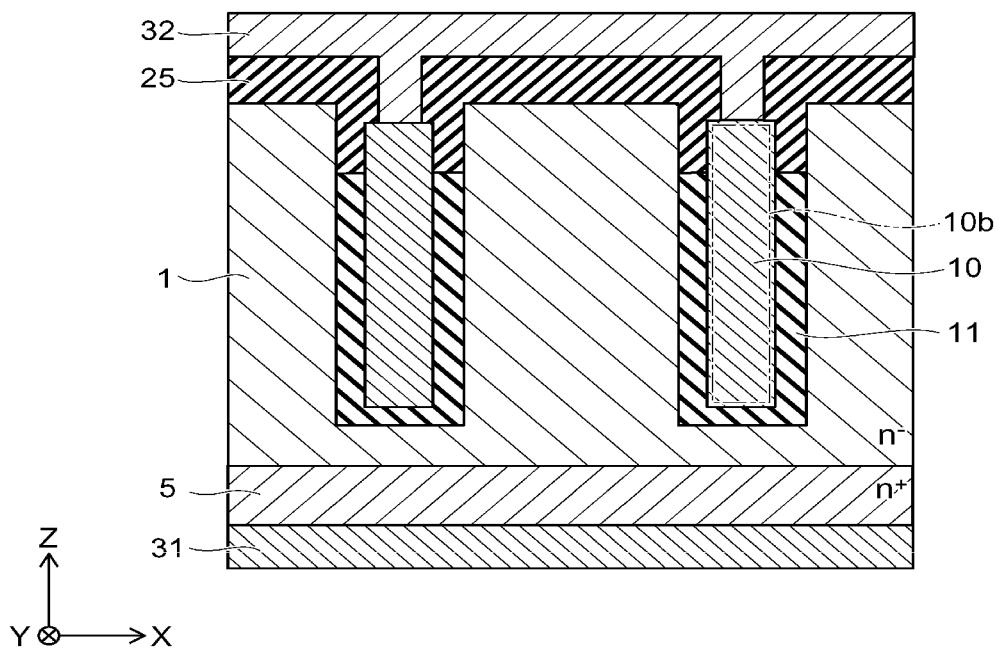

FIGS. 10A and 10B are cross-sectional views each showing a part of a semiconductor device 110 according to a first modified example of the first embodiment.

In the semiconductor device 110, the first insulating portion 11 is an insulating layer containing an insulating material. Therefore, the thickness required of the first insulating portion 11 in order to suppress a dielectric breakdown in the first insulating portion 11 is more increased than in the case where the first insulating portion 11 is the gap.

However, the dielectric constant of the first insulating portion 11 is lower than the dielectric constant of the second insulating portion 12. Therefore, according to the modified example, the electric field intensity between the first insulating portion 11 and the second insulating portion 12 can be increased, as shown in FIG. 9. In short, also according to the modified example, compared to the semiconductor device according to the related art, the breakdown voltage in the semiconductor device can be improved.

Second Modified Example

Figure 11A:
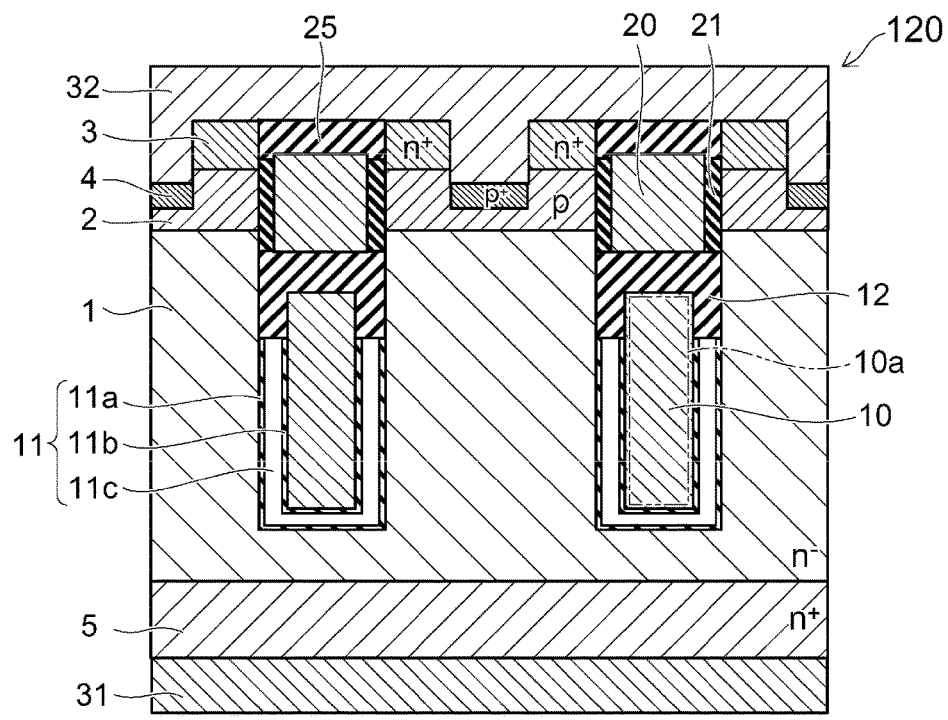
FIGS. 11A and 11B are cross-sectional views each showing apart of a semiconductor device according to a second modified example of the first embodiment.
Figure 11B:
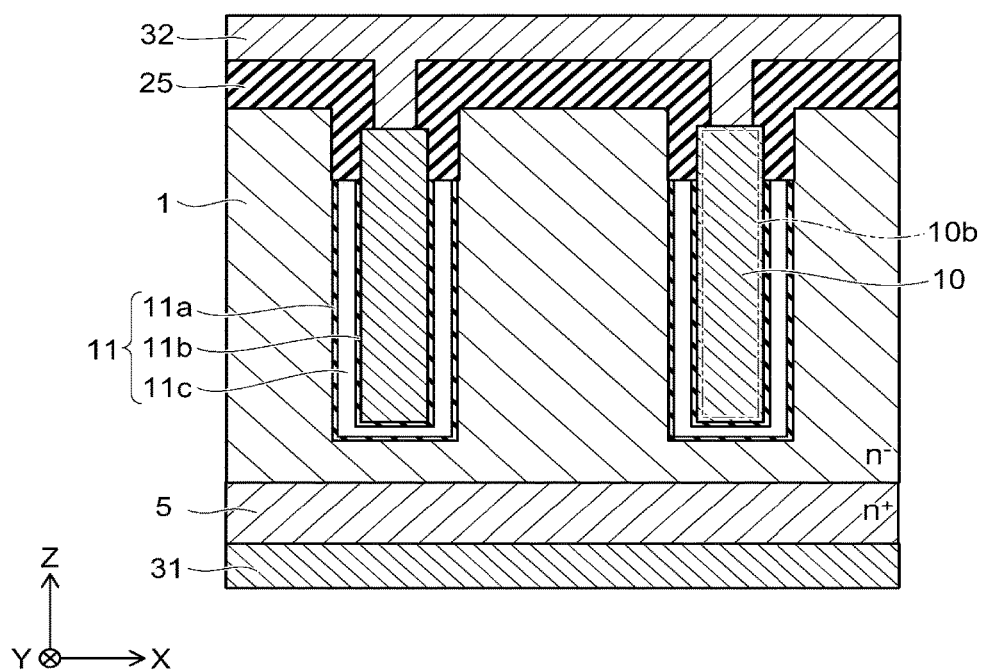

FIGS. 11A and 11B are cross-sectional views each showing a part of a semiconductor device 120 according to a second modified example according to the first embodiment.

In the semiconductor device 120, the first insulating portion 11 includes the insulating layer 11a (first insulating layer), the insulating layer 11b (second insulating layer), and a gap 11c. The insulating layer 11a is provided between the n⁻ type semiconductor region 1 and the gap 11c. The insulating layer 11b is provided between the FP electrode 10 and the gap 11c. The insulating layer 11a covers the surface of the n⁻ type semiconductor region 1 facing the gap 11c and the insulating layer 11b covers the surface of the FP electrode 10 facing the gap 11c.

The insulating layers 11a and 11b are formed by, after removing the insulating layer IL1 in the process shown in FIG. 7C, oxidizing the surface of the n⁻ type semiconductor region 1 and the FP electrode 10 exposed by the same process.

According to the structure, it is possible to reduce a leak current caused by a surface level of the FP electrode 10 and the n⁻ type semiconductor region 1. Further, the first insulating portion 11 has the gap 11c and the dielectric constant of the whole first insulating portion 11 is lower than the dielectric constant of the second insulating portion 12. Therefore, also in the modified example, it is possible to enhance the electric field intensity between the first insulating portion 11 and the second insulating portion 12 and improve the breakdown voltage of the semiconductor device, similarly to the semiconductor device 100.

Third Modified Example

Figure 12A:
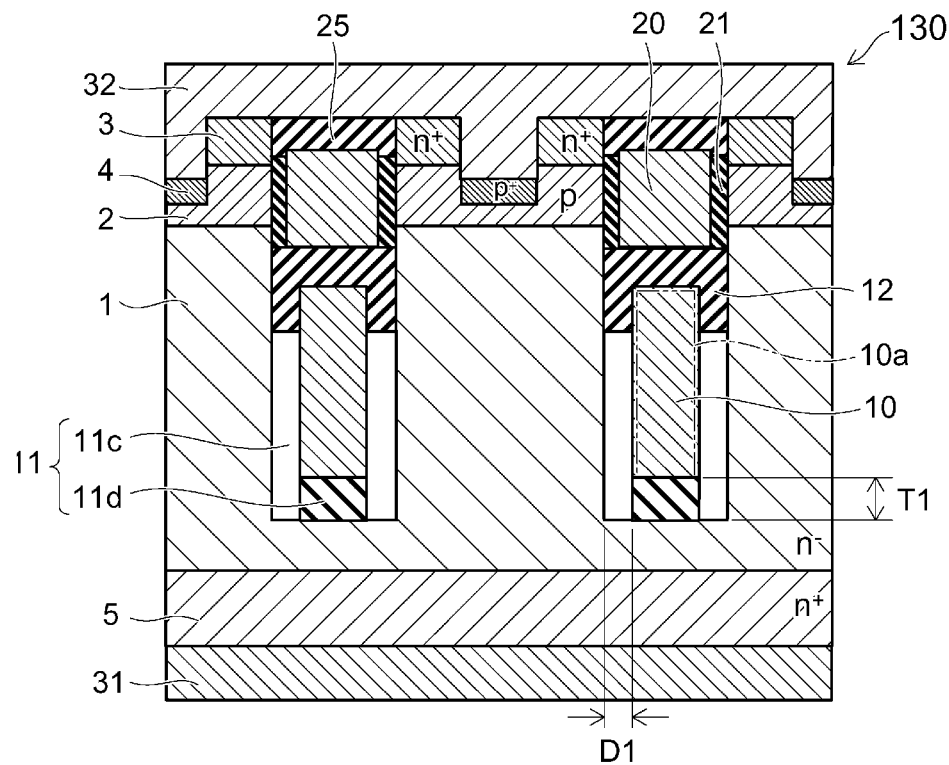
FIGS. 12A and 12B are cross-sectional views each showing a part of a semiconductor device according to a third modified example of the first embodiment.
Figure 12B:
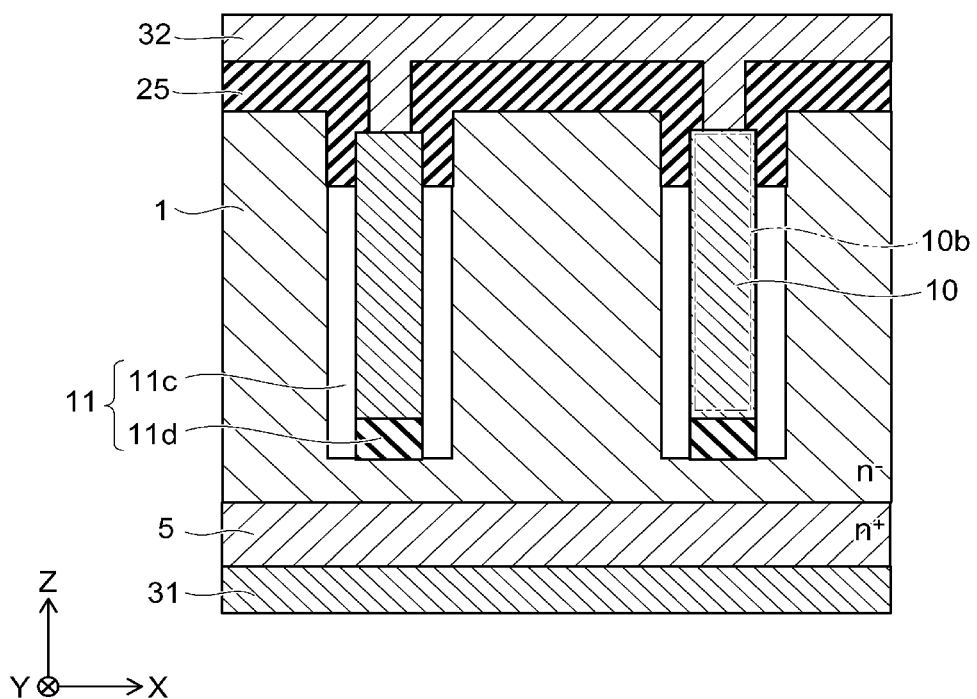

FIGS. 12A and 12B are cross-sectional views each showing a part of a semiconductor device 130 according to a third modified example of the first embodiment.

In the semiconductor device 130, the first insulating portion 11 includes the gap 11c and the insulating layer 11d (third insulating layer). The insulating layer 11d is provided between the n⁻ type semiconductor region 1 and the FP electrode 10 in the Z direction, in contact with the both. In short, the FP electrode 10 is mounted on the n⁻ type semiconductor region 1 with the insulating layer 11d interposed therebetween.

According to the modified example, since the FP electrode 10 is supported by the insulating layer 11d, it is possible to reduce such a possibility that the FP electrode 10 is removed from the second insulating portion 12 and falls down to the n⁻ type semiconductor region 1. Also in the modified example, since the dielectric constant of the whole first insulating portion 11 is lower than the dielectric constant of the second insulating portion 12, it is possible to improve a breakdown voltage in the semiconductor device.

In the modified example, in order to suppress the dielectric breakdown in the insulating layer 11d, the thickness T1 of the insulating layer 11d in the Z direction is preferably larger than the measurement D1 (a distance between the FP electrode 10 and the n⁻ type semiconductor region 1 in the X direction) of the gap 11c in the X direction.

More specifically, when the specific dielectric constant of the insulating layer 11d is defined as ki and the specific dielectric constant of the gap 11c is defined as k0, a relation of T1>D1×ki/k0 is preferable.

Fourth Modified Example

Figure 13A:
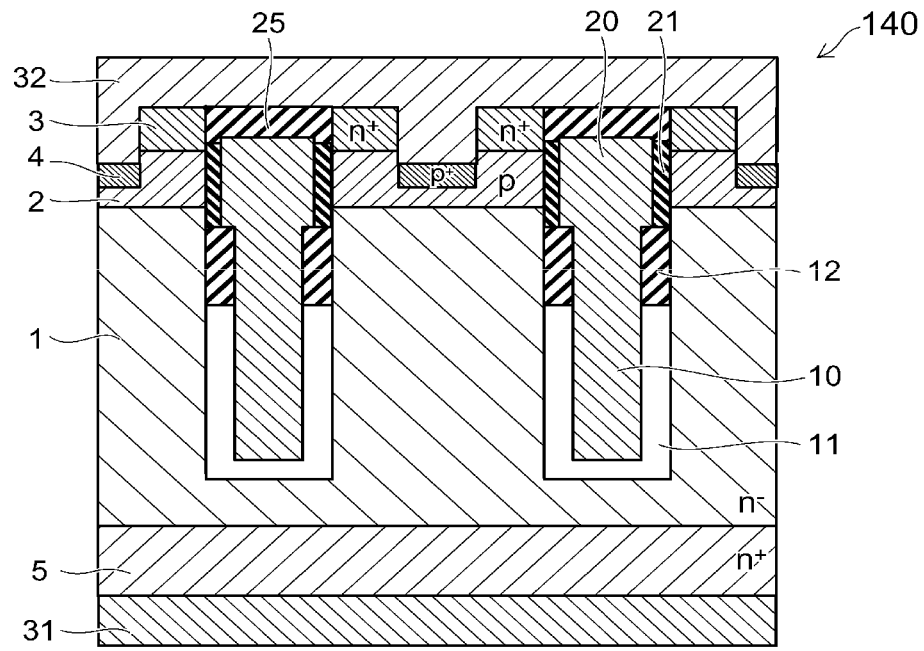
FIGS. 13A and 13B are cross-sectional views each showing apart of a semiconductor device according to a fourth modified example of the first embodiment.
Figure 13B:
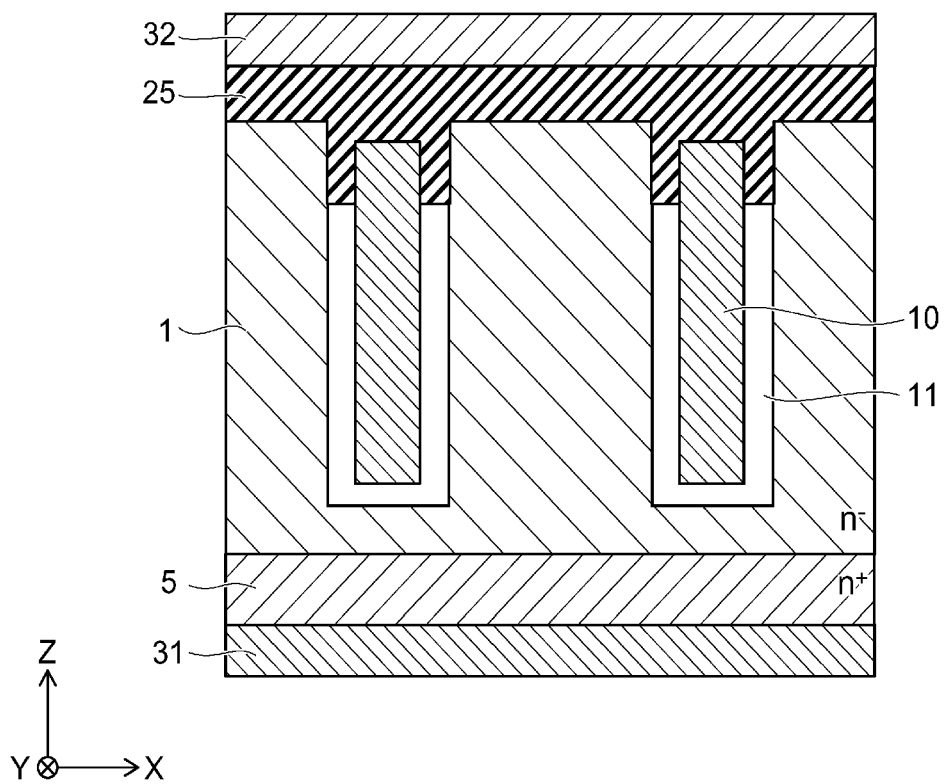

FIGS. 13A and 13B are cross-sectional views each showing a part of a semiconductor device 140 according to a fourth modified example of the first embodiment.

In the semiconductor devices 100 to 120, the FP electrode 10 is electrically coupled to the source electrode 32. On the contrary, in the semiconductor device 130, the FP electrode 10 and the gate electrode 20 are integrally formed and a gate voltage is applied to the FP electrode 10.

Also in the structure of the semiconductor device 130, when the semiconductor device is switched from the on state to the off state, a depletion layer expands from the interface between the first insulating portion 11 and the n⁻ type semiconductor region 1 into the n⁻ type semiconductor region 1, according to a potential difference between the gate electrode 20 and the drain electrode 31.

Therefore, according to the modified example, it is possible to decrease the thickness of the first insulating portion 11 and reduce the on resistance in the semiconductor device, similarly to the semiconductor device 100. Further, it is possible to enhance the electric field intensity between the first insulating portion 11 and the second insulating portion 12 and improve the breakdown voltage in the semiconductor device.

Second Embodiment

Using FIGS. 14 to 17, an example of a semiconductor device according to a second embodiment will be described.

A semiconductor device 200 is different from the semiconductor device 100 mainly in the structure of the FP electrode 10.

Figure 14:
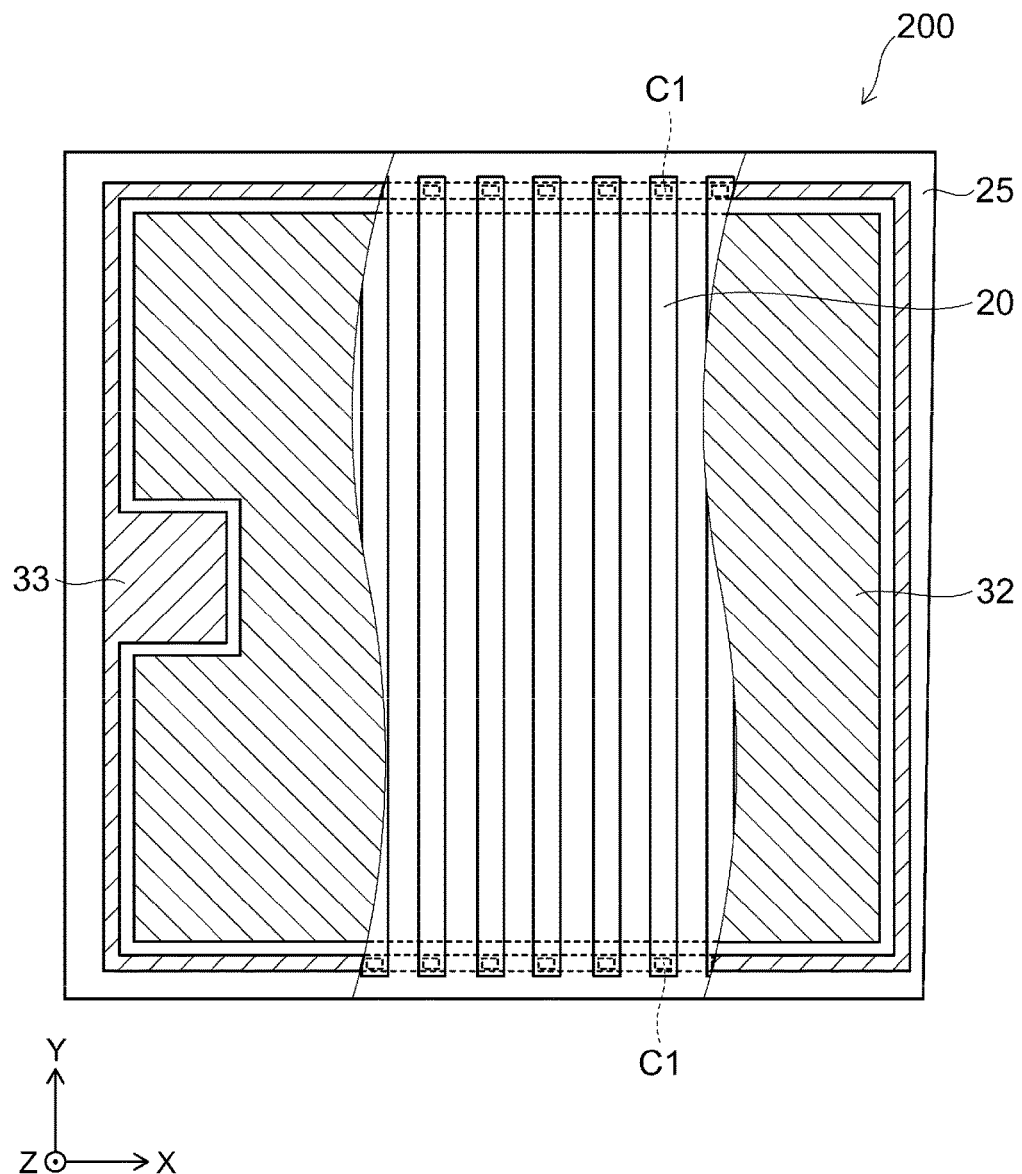
FIGS. 14-15 are each a top plan view of a semiconductor device according to a second embodiment.
Figure 15:
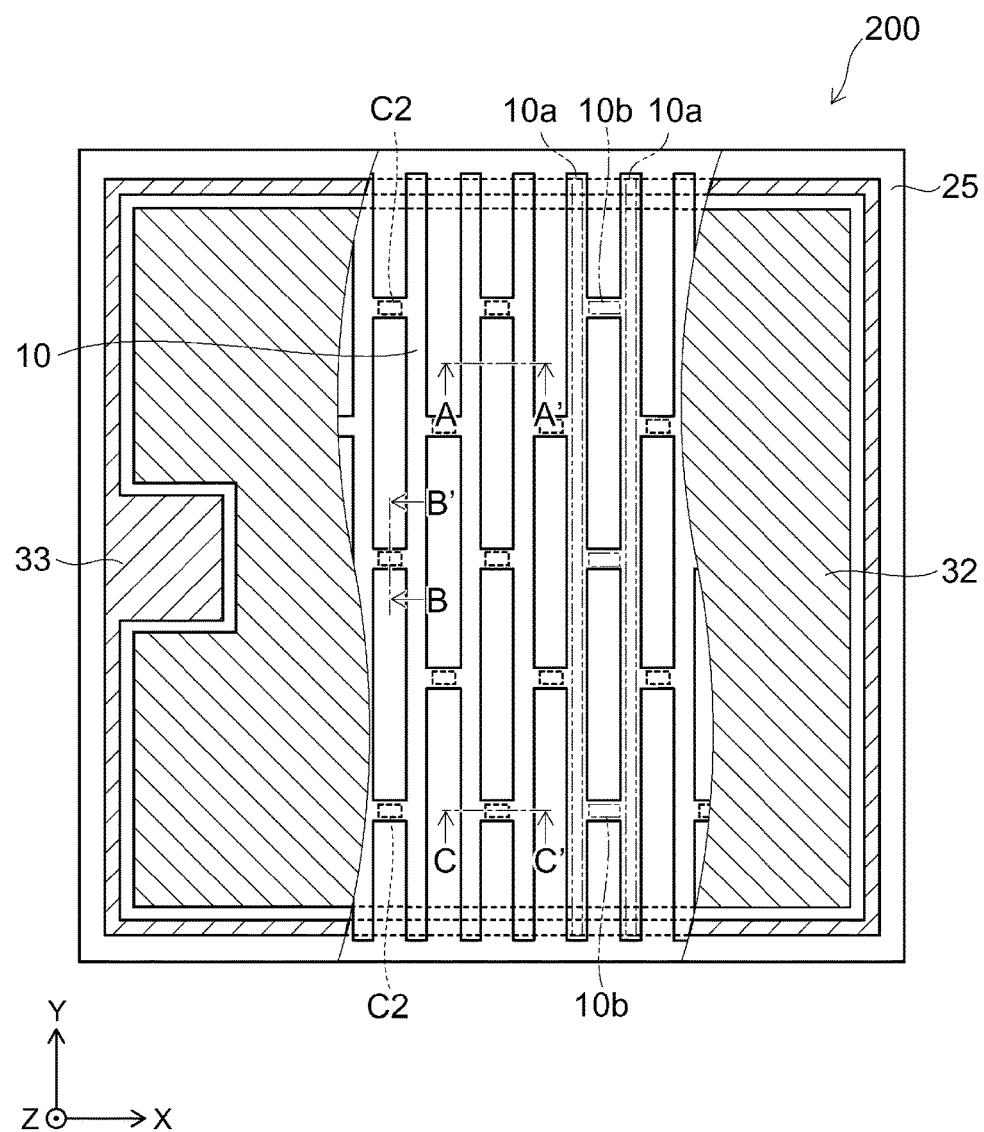

FIGS. 14 and 15 are top plan views of the semiconductor device 200 according to the second embodiment.

Figure 16A:
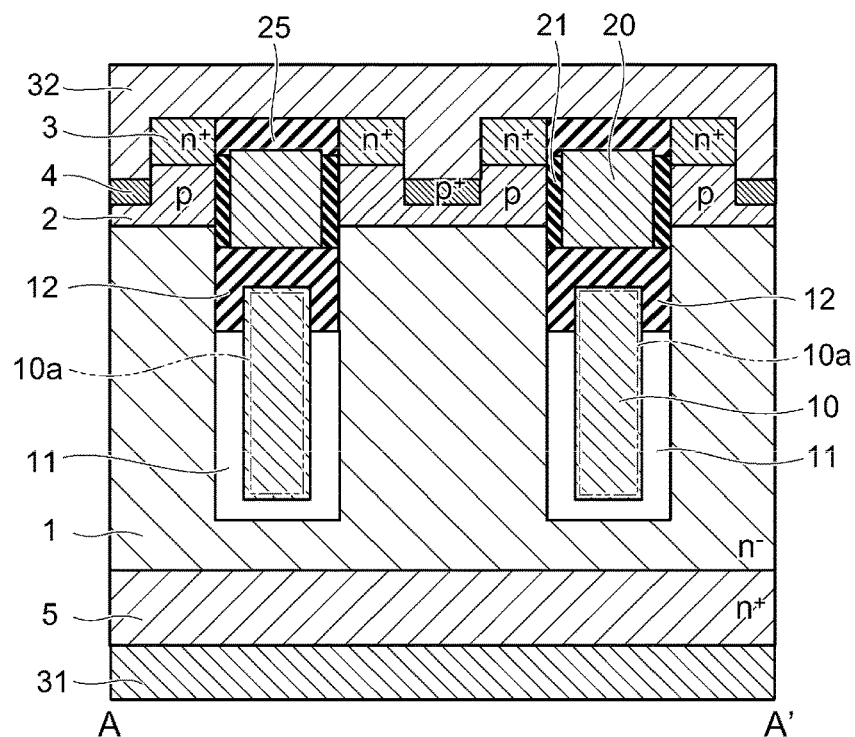
FIGS. 16A and 16B are cross-sectional views each showing a part of the semiconductor device according to the second embodiment.
Figure 16B:
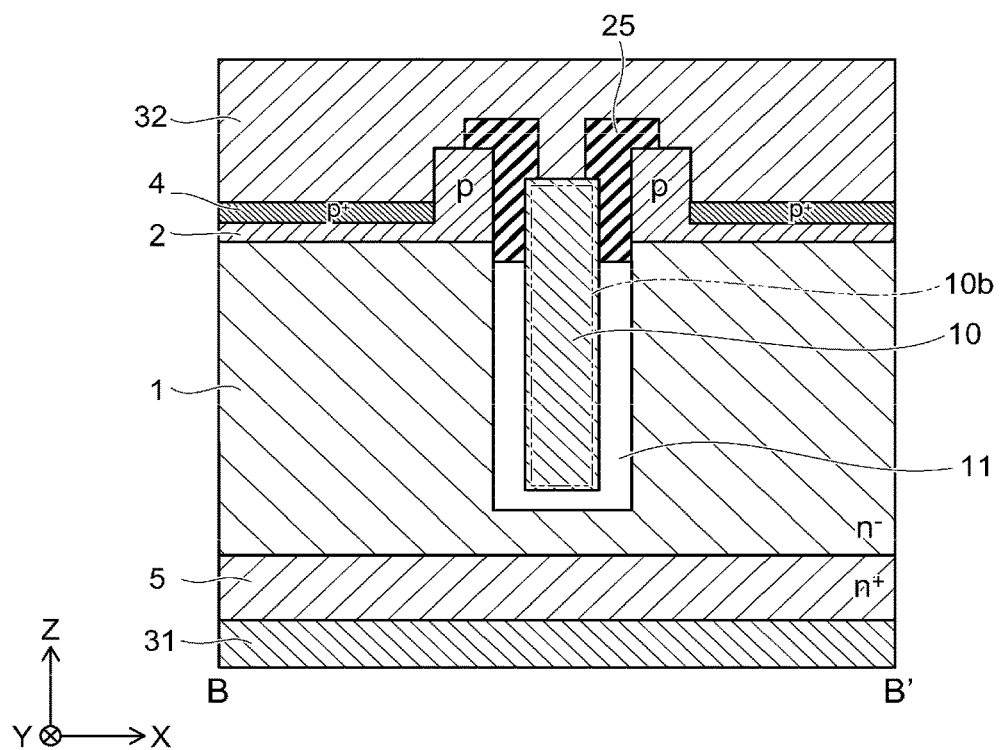

FIG. 16A is a cross-sectional view taken along the line A-A' in FIG. 15 and FIG. 16B is a cross-sectional view taken along the line B-B' in FIG. 15.

Figure 17:
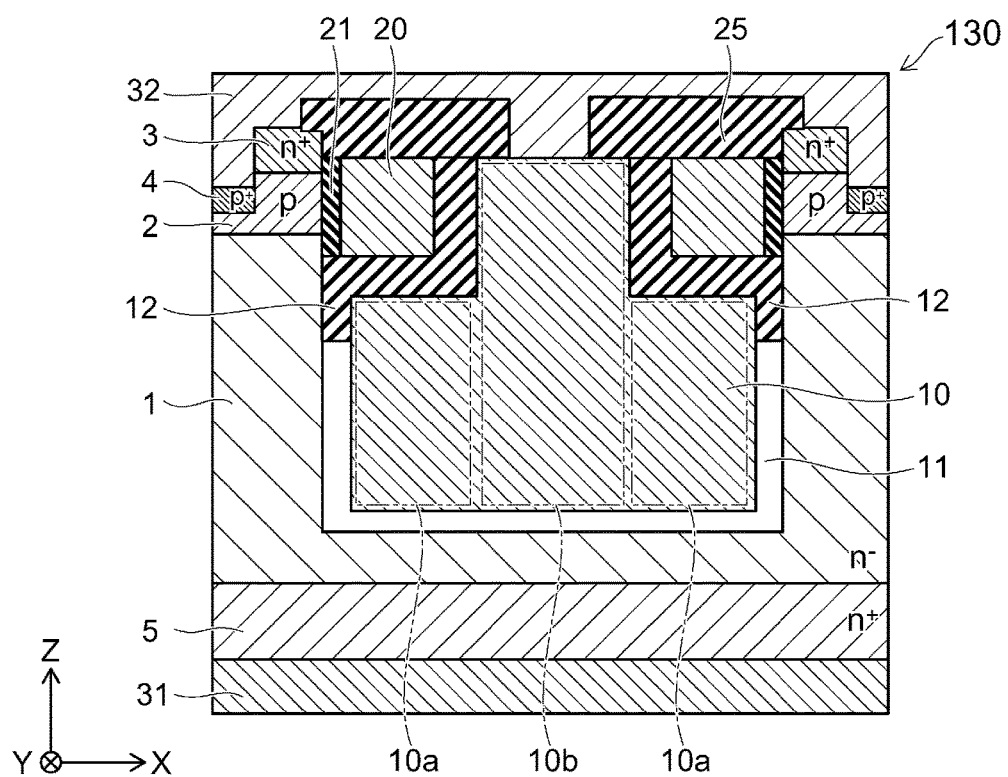
FIG. 17 is a cross-sectional view showing a part of the semiconductor device according to the second embodiment.

FIG. 17 is a cross-sectional view taken along the line C-C' in FIG. 15.

In FIG. 14, a part of the insulating layer 25, the source electrode 32, and the gate pad 33 is made transparent in order to show the gate electrode 20.

Similarly, in FIG. 15, a part of the insulating layer 25, the source electrode 32, and the gate pad 33 is made transparent in order to show the FP electrode 10. In FIG. 15, a part of the connection portions C2 is omitted in order to show the first electrode portion 10a and the second electrode portion 10b.

In the semiconductor device 200, as shown in FIG. 14, the respective gate electrodes 20 extend in the Y direction and are electrically coupled to the gate pad 33 at the connection portions C1.

As shown in FIGS. 15 to 17, the FP electrode 10 has the first electrode portion 10a and the second electrode portion 10b. A plurality of the first electrode portions 10a are arranged along the X direction, each extending in the Y direction. The second electrode portions 10b are provided between the first electrode portions 10a, in contact with the first electrode portions 10a. Further, the second electrode portions 10b are in contact with the connection portions C2 and the FP electrodes 10 are electrically coupled to the source electrode 32.

As shown in FIG. 17, a part of the second electrode portion 10b is located between the gate electrodes 20 in the X direction.

An example of the manufacturing method of the semiconductor device 200 will be described using FIGS. 18A to 20D.

FIGS. 18A to 20B are cross-sectional views each showing the manufacturing process of the semiconductor device according to the second embodiment. Here, in each of FIGS. 18A to 20B, the left side indicates the manufacturing process in a part taken along the line C-C' in FIG. 15 and the right side indicates the manufacturing process in a part taken along the line B-B' in FIG. 15.

At first, a trench T is formed in the surface of the n⁻ type semiconductor layer 1a. Here, the trench T is formed according to the shape of the FP electrode 10 shown in FIG. 15. Subsequently, the insulating layer IL1 is formed in the inner wall of the trench T (FIG. 18A).

Next, a conductive layer is formed on the insulating layer IL1. The top surface of the conductive layer is selectively etched back, hence to form the FP electrode 10 including the first electrode portion 10a and the second electrode portion 10b (FIG. 18B). Thereafter, the insulating layer IL2 is formed (FIG. 18C). Apart of the insulating layer IL2 is removed and the insulating layer IL3 is formed on the exposed surface of the n⁻ type semiconductor layer 1a (FIG. 18D).

Figure 19A:
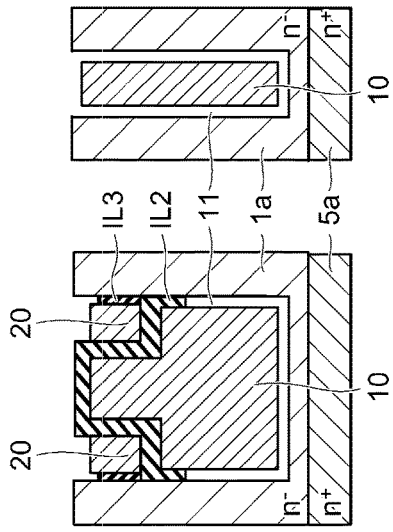
FIGS. 19A to 19D are cross-sectional views each showing the manufacturing process of the semiconductor device according to the second embodiment.

Next, the gate electrode 20 is formed on the first electrode portion 10a (FIG. 19A). Subsequently, a part of the insulating layer IL3 is removed, hence to expose the top surface of the insulating layer IL1 provided around the second electrode portion 10b. Thereafter, by removing the insulating layer IL1, the gap (first insulating portion 11) is formed between the FP electrode 10 and the n⁻ type semiconductor layer 1a (FIG. 19B).

Figure 19C:
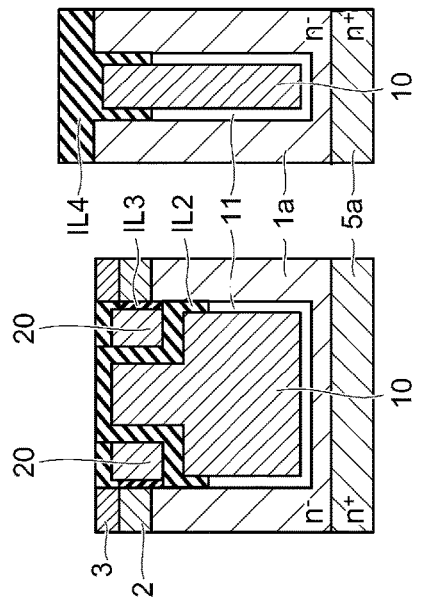
Figure 19B:
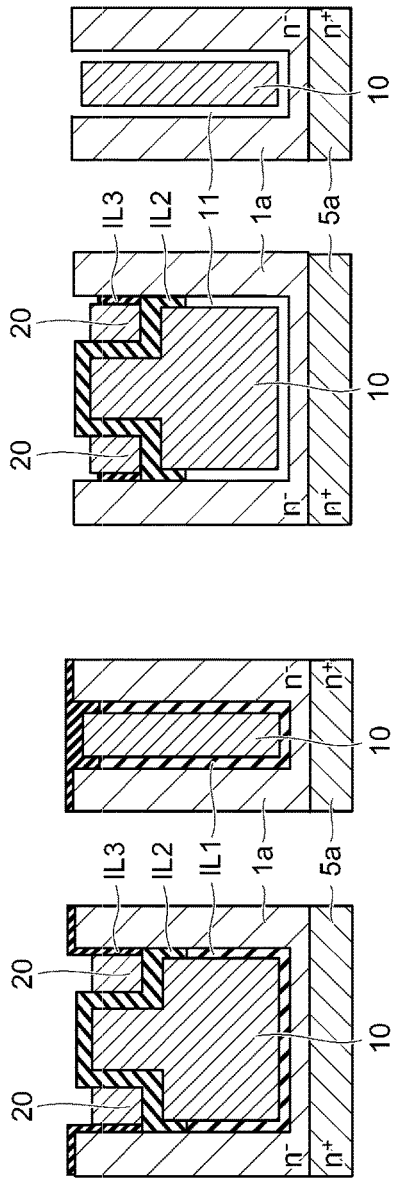
Figure 19D:
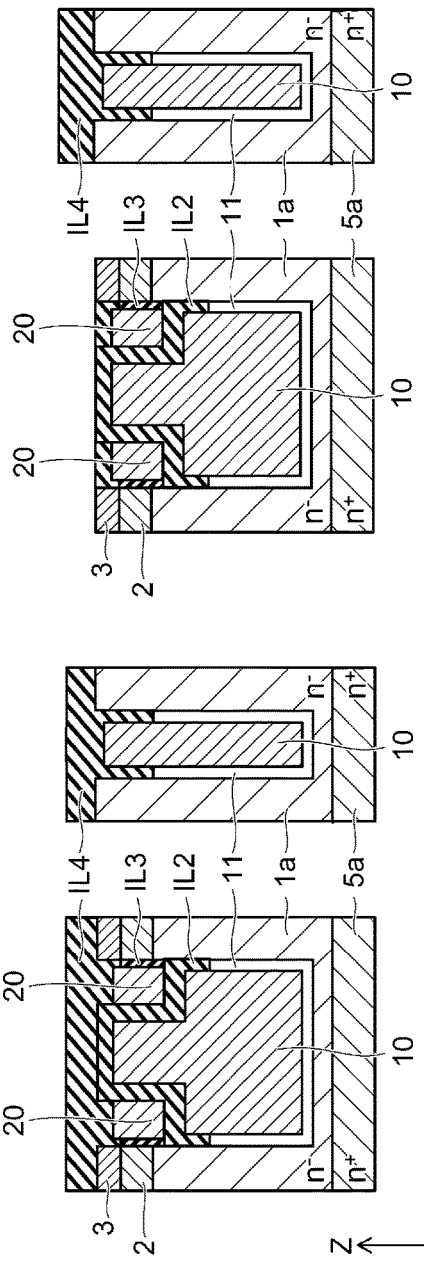

Next, the insulating layer IL4 to plug the upper portion of the gap is formed (FIG. 19C). Subsequently, a part of the insulating layer IL4 is removed and the p type base region 2 and the n+ type source region 3 are formed on the top surface of the n⁻ type semiconductor layer 1a (FIG. 19D).

Figure 20A:
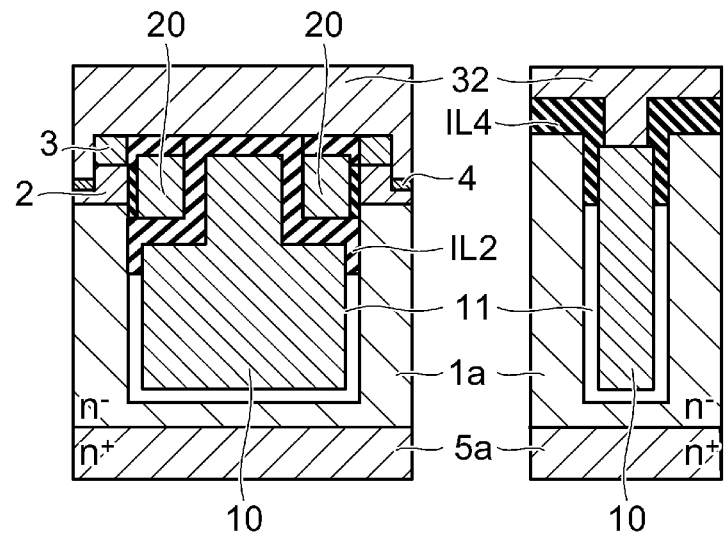
FIGS. 20A and 20B are cross-sectional views each showing the manufacturing process of the semiconductor device according to the second embodiment.
Figure 20B:
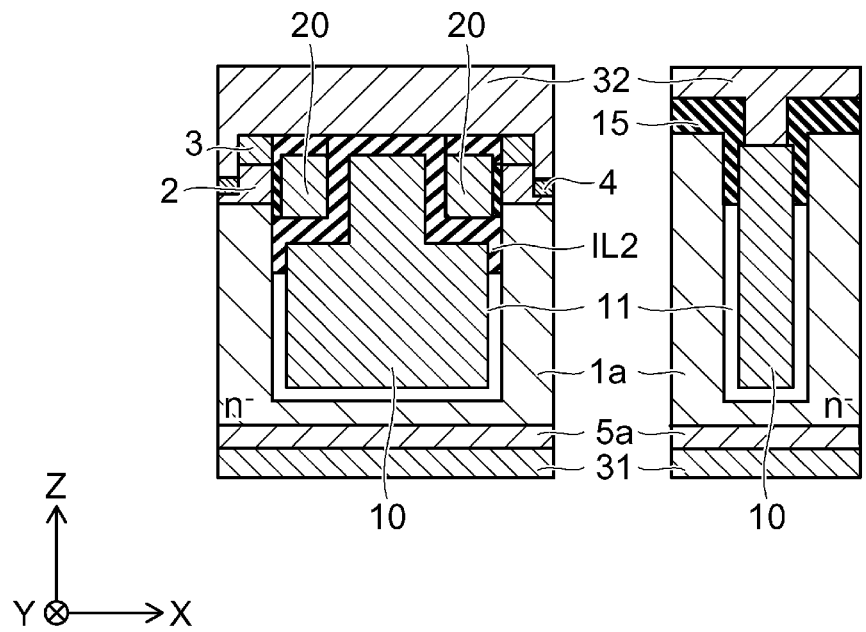

Then, an opening arriving at the p type base region 2 is formed and the p+ type contact region 4 is formed in a part of the p type base region 2. Subsequently, a part of the insulating layer IL4 is removed to expose the top surface of the second electrode portion 10b, and then the source electrode 32 and the gate pad 33 (not illustrated) are formed (FIG. 20A). Then, the rear surface of the n⁺ type semiconductor layer 5a is polished to form the drain electrode 31 (FIG. 20B).

According to the above process, the semiconductor device 200 shown in FIGS. 14 to 17 can be obtained.

As shown in FIGS. 16A and 16B and FIG. 17, the top of the second electrode portion 10b is surrounded by the second insulating portion 12 and the insulating layer 25, and the contact area thereof is larger than the contact area of the first electrode portion 10a and the second insulating portion 12. In other words, the second electrode portion 10b is strongly supported by the second insulating portion 12 and the insulating layer 25 more than the first electrode portion 10a. By provided the plural second electrode portions 10b between the first electrode portions 10a, the possibility of the FP electrode 10 detached from the second insulating portion 12, and coming into contact with the n⁻ type semiconductor region 1 can be reduced.

Further, according to the embodiment, it is possible to decrease the thickness of the first insulating portion 11 and reduce the on resistance in the semiconductor device, similarly to the first embodiment. Further, since the gap is formed as the first insulating portion 11, it is possible to enhance the electric field intensity between the first insulating portion 11 and the second insulating portion 12 and improve a breakdown voltage in the semiconductor device.

In the semiconductor device according to the above mentioned second embodiment, the same structure as that of each modified example of the first embodiment can be adopted.

According to the manufacturing method of the semiconductor device according to the embodiment, as shown in FIGS. 19A and 19B, chemical liquid is poured into the trench T from the outer periphery of the second electrode portion 10b, to remove the insulating layer IL1. The several second electrode portions 10b are provided between the first electrode portions 10a, and by pouring the chemical liquid from the outer periphery of the second electrode portion 10b, the insulating layer IL1 between the n⁻ type semiconductor region 1 and the FP electrode 10 can be removed easily.

In short, according to the manufacturing method of the semiconductor device of the embodiment, the gap can be formed between the n⁻ type semiconductor region 1 and the FP electrode 10 more easily than according to the manufacturing method of the semiconductor device of the first embodiment.

A relative degree of the dopant concentration between the respective semiconductor regions in the above mentioned embodiments can be confirmed, for example, by using a scanning capacitance microscope (SCM). The carrier concentration in each semiconductor region can be regarded equal to the dopant concentration activated in each semiconductor region. Accordingly, a relative degree of the carrier concentration in each semiconductor region can be confirmed by using the SCM.

Further, the dopant concentration in each semiconductor region can be measured, for example, according to a secondary ion composition analysis method (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, the specific structure as for the respective components such as the n⁺ type drain region 5, the n⁻ type semiconductor region 1, the p type base region 2, the n⁺ type source region 3, the p⁺ type contact region 4, the FP electrode 10, the first insulating portion 11, the second insulating portion 12, the gate electrode 20, the gate insulating portion 21, the insulating layer 25, the drain electrode 31, the source electrode 32, and the gate pad 33 included in the embodiments can be properly selected from the well known technique by those skilled in the art. The accompanying claims and their equivalents are intended to cover such forms or modifications as would fall within the scope and spirit of the inventions. Further, the respective embodiments can be properly combined.

What is claimed is:

1. A semiconductor device comprising:
   a first semiconductor region of a first conductivity type;
   a second semiconductor region of a second conductivity type on the first semiconductor region;
   a third semiconductor region of the first conductivity type on the second semiconductor region;
   a first electrode surrounded by the first semiconductor region;
   a gate electrode above the first electrode;
   a gate insulating portion between the second semiconductor region and the gate electrode;
   a first insulating portion in contact with a first part of the first electrode and between the first part of the first electrode and the first semiconductor region; and
   a second insulating portion having a higher dielectric constant than the first insulating portion and the same dielectric constant as the gate insulating portion, in contact with a second part of the first electrode and between the second part of the first electrode and the first semiconductor region, the second part of the first electrode located closer to the gate electrode than the first part of the first electrode.

2. The semiconductor device according to claim 1, wherein
   the first insulating portion is an air gap.

3. The semiconductor device according to claim 2, wherein
   the first insulating portion includes a first insulating layer between the first semiconductor region and the air gap and a second insulating layer between the first part of the first electrode and the air gap.

4. The semiconductor device according to claim 2, wherein
the first insulating portion includes an insulating layer in contact with the first semiconductor region and a lower surface of the first part of the first electrode.

5. The semiconductor device according to claim 1, wherein
the first insulating portion includes an insulating layer in contact with the first part of the first electrode and the first semiconductor region such that there is no air gap between the first part of the first electrode and the first semiconductor region.

6. The semiconductor device according to claim 5, wherein
the second insulating portion electrically isolates the first electrode from the gate electrode.

7. The semiconductor device according to claim 1, wherein
the first part is longer in a direction toward the gate electrode than the second part.

8. The semiconductor device according to claim 1, wherein
the gate electrode extends in a first direction and the first electrode includes a first portion that extends in the first direction below the gate electrode and a second portion that extends in a second direction to be higher than an upper end of the first portion.

9. The semiconductor device according to claim 8, wherein
the gate electrode is connected to the first portion of the first electrode.

10. The semiconductor device according to claim 8, wherein the second portion is aligned with the gate electrode along the first direction.

11. The semiconductor device according to claim 8, wherein the second portion is not aligned with the gate electrode along the first direction.

12. A semiconductor device comprising:
a drain electrode;
a drain region electrically coupled to the drain electrode;
a first semiconductor region on the drain region;
a second semiconductor region on the first semiconductor region;
a contact region and a source region, each selectively provided on the second semiconductor region;
a source electrode electrically coupled to the contact region and the source region;
a field plate electrode surrounded by the first semiconductor region and separated from the first semiconductor region by first and second insulating portions, the first insulating portion located closer to the drain region and having a lower dielectric constant than the second insulating portion;
a gate electrode above the field plate electrode and electrically isolated from the source electrode; and
a gate insulating portion, between the second semiconductor region and the gate electrode, and having the same dielectric constant as the second insulating portion.

13. The semiconductor device according to claim 12, wherein
the first insulating portion is an air gap.

14. The semiconductor device according to claim 13, wherein
the first insulating portion includes a first insulating layer between the first semiconductor region and the air gap and a second insulating layer between the field plate electrode and the air gap.

15. The semiconductor device according to claim 13, wherein
the first insulating portion includes an insulating layer in contact with the first semiconductor region and a lower surface of the field plate electrode.

16. The semiconductor device according to claim 12, wherein
the second insulating portion electrically isolates the field plate electrode from the gate electrode.

17. The semiconductor device according to claim 12, wherein
the gate electrode extends in a first direction and the field plate electrode includes a first portion that extends in the first direction below the gate electrode and a second portion that extends in a second direction to be higher than an upper end of the first portion.

18. The semiconductor device according to claim 17, wherein
the gate electrode is connected to the field plate electrode.

19. The semiconductor device according to claim 17, wherein the second portion is aligned with the gate electrode along the first direction.

20. The semiconductor device according to claim 17, wherein the second portion is not aligned with the gate electrode along the first direction.

21. The semiconductor device according to claim 12, wherein
the first insulating portion includes an insulating layer in contact with the field plate electrode and the first semiconductor region such that there is no air gap between the field plate electrode and the first semiconductor region.

* * * * *